United States Patent
Hattori

(10) Patent No.: US 8,509,277 B2
(45) Date of Patent: Aug. 13, 2013

(54) OPTICAL DEVICE

(75) Inventor: Yoshikazu Hattori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/710,779

(22) Filed: Feb. 23, 2010

(65) Prior Publication Data

US 2010/0215070 A1 Aug. 26, 2010

(30) Foreign Application Priority Data

Feb. 24, 2009 (JP) .................................. 2009-40931

(51) Int. Cl.
*H01S 5/00* (2006.01)

(52) U.S. Cl.
USPC ................ 372/50.11; 372/43.01; 372/50.124; 372/50.121; 257/E21.158; 257/E21.215; 438/29; 438/31; 438/32; 438/620; 438/639

(58) Field of Classification Search
USPC ........... 372/50.124, 22, 50.11, 43.01, 50.121; 438/29, 31, 32, 620, 639; 257/96, 98, 773, 257/774, 776, E33.062, E33.069, E23.152, 257/E23.151, E23.168, E23.175, E21.578
See application file for complete search history.

(56) References Cited

U.S. PATENT DOCUMENTS

| | | | | |
|---|---|---|---|---|
| 5,812,574 | A * | 9/1998 | Takeuchi et al. | ........... 372/45.01 |
| 6,687,268 | B2 | 2/2004 | Kitamura et al. | |
| 7,381,581 | B2 | 6/2008 | Suzuki | |
| 2001/0011730 | A1 | 8/2001 | Saeki | |
| 2002/0094004 | A1 * | 7/2002 | Furukawa | ........................ 372/46 |
| 2003/0053503 | A1 * | 3/2003 | Yang | ................. 372/45 |
| 2004/0161006 | A1 * | 8/2004 | Chang et al. | ..................... 372/45 |
| 2005/0100068 | A1 * | 5/2005 | Jikutani et al. | ................... 372/46 |
| 2006/0007979 | A1 * | 1/2006 | Jikutani et al. | ................... 372/92 |
| 2006/0038191 | A1 * | 2/2006 | Onishi et al. | ..................... 257/96 |
| 2006/0118799 | A1 * | 6/2006 | D'Evelyn et al. | ............... 257/96 |
| 2006/0171437 | A1 * | 8/2006 | Takahashi | ................ 372/50.124 |
| 2007/0121695 | A1 * | 5/2007 | Miyamoto | ............... 372/50.124 |
| 2007/0217474 | A1 * | 9/2007 | Otake et al. | ............. 372/50.124 |
| 2008/0056323 | A1 * | 3/2008 | Yoshikawa et al. | ........ 372/46.01 |
| 2008/0144683 | A1 * | 6/2008 | Nakahara et al. | .......... 372/45.01 |

(Continued)

FOREIGN PATENT DOCUMENTS

| | | |
|---|---|---|
| JP | H06-097578 A | 4/1994 |
| JP | 8-213711 A | 8/1996 |
| JP | 2002-359434 | 12/2002 |
| JP | 2002-368334 A | 12/2002 |
| JP | 2005-44964 A | 2/2005 |
| JP | 2006-073965 A | 3/2006 |
| JP | 2007-173394 A | 7/2007 |
| JP | 2001-223384 | 6/2013 |

OTHER PUBLICATIONS

Japanese Office Action dated Oct. 23, 2012 for corresponding Japanese Application No. 2009-040931, with Partial English-language Translation.
Japanese Office Action mailed Apr. 30, 2013 for corresponding Japanese Application No. 2009-040931, with English-language translation.

*Primary Examiner* — Jessica Stultz
*Assistant Examiner* — Delma R Forde
(74) *Attorney, Agent, or Firm* — Fujitsu Patent Center

(57) ABSTRACT

A multiwavelength optical device includes a substrate; a first mirror section including a plurality of first mirror layers stacked on the substrate; an active layer stacked on the first mirror section, the active layer including a light emission portion; a second mirror section including a plurality of second mirror layers stacked on the active layer; a first electrode disposed between the active layer and the second mirror section; and a second electrode disposed between the first mirror section and the active layer.

11 Claims, 26 Drawing Sheets

(56) References Cited

U.S. PATENT DOCUMENTS

| | | |
|---|---|---|
| 2008/0187015 A1* | 8/2008 | Yoshikawa et al. ........ 372/45.01 |
| 2009/0074025 A1* | 3/2009 | Takahashi ................ 372/50.124 |
| 2009/0196318 A1* | 8/2009 | Uchida ...................... 372/45.01 |
| 2009/0245312 A1* | 10/2009 | Kageyama et al. ......... 372/46.01 |
| 2009/0310637 A1* | 12/2009 | Kageyama et al. ......... 372/43.01 |
| 2011/0165712 A1* | 7/2011 | Uchida ........................... 438/34 |
| 2011/0182314 A1* | 7/2011 | Yoshikawa et al. ...... 372/46.012 |
| 2011/0241564 A1* | 10/2011 | Shimizu et al. ............... 315/291 |

* cited by examiner

OPTICAL DEVICE

CROSS-REFERENCE TO RELATED APPLICATION

This application is based upon and claims the benefit of priority of the prior Japanese Patent Application No. 2009-40931, filed on Feb. 24, 2009, the entire contents of which are incorporated herein by reference.

FIELD

The embodiments discussed herein are related to a multiwavelength optical device, such as a multiwavelength laser device, and a manufacturing method of the multiwavelength laser device.

BACKGROUND

In recent years, a VCSEL (Vertical Cavity Surface Emitting Laser) device has been proposed because of a surface-mount compatibility, power saving or cost reduction. Incidentally, with increases in communication capacity, an optical communication apparatus using a laser as a light source performs multiplex communication by introducing a plurality of laser beams having different wavelengths into a single optical fiber.

To comply with the multiplex communication requirements, according to Japanese Patent Laid-Open Nos. 2007-173394, 2006-073965, and 06-097578, multiwavelength laser devices that can emit a plurality of laser beams having different wavelengths are disclosed. The multiwavelength laser device is provided with the number of light emission portions equivalent to the number of wavelengths to be used. A plurality of desired laser beams having different wavelengths can be generated by resonating a light in the light emitting portions.

Like this, since the number of light emitting portions equivalent to the number of wavelengths to be used is provided in the multiwavelength laser devices, electrodes are provided on each light emitting portion for power feeding. Further, such a multiwavelength laser device for generating laser beams having different wavelengths has a plurality of mirror layers therein. Therefore, the multiwavelength laser device has a complicate internal structure as compared to a single-wavelength laser device. For this reason, according to JP-A-2006-073965, electrodes are provided at the top and bottom of the multiwavelength laser device.

However, according to JP-A-2006-073965, since a plurality of mirror layers having high electric resistances intervene between the electrodes of the top and bottom of the device, the electric resistance between the electrodes may increase, which leads to high power consumption of the multiwavelength laser device.

SUMMARY

According to an embodiment, a multiwavelength optical device includes a substrate, a first mirror section, an active layer, a second mirror section, a first electrode and a second electrode. The first mirror section includes a plurality of first mirror layers stacked on the substrate. The active layer is stacked on the first mirror section, and includes a light emission portion. The second mirror section includes a plurality of second mirror layers stacked on the active layer. The first electrode is disposed between the active layer and the second mirror section. The second electrode is disposed between the first mirror section and the active layer.

It is to be understood that both the foregoing summary description and the following detailed description are exemplary, and do not restrict the invention as claimed.

DESCRIPTION OF EMBODIMENTS

Exemplary embodiments of the present invention will be described below with reference to the accompanying drawings.

Figure 1:
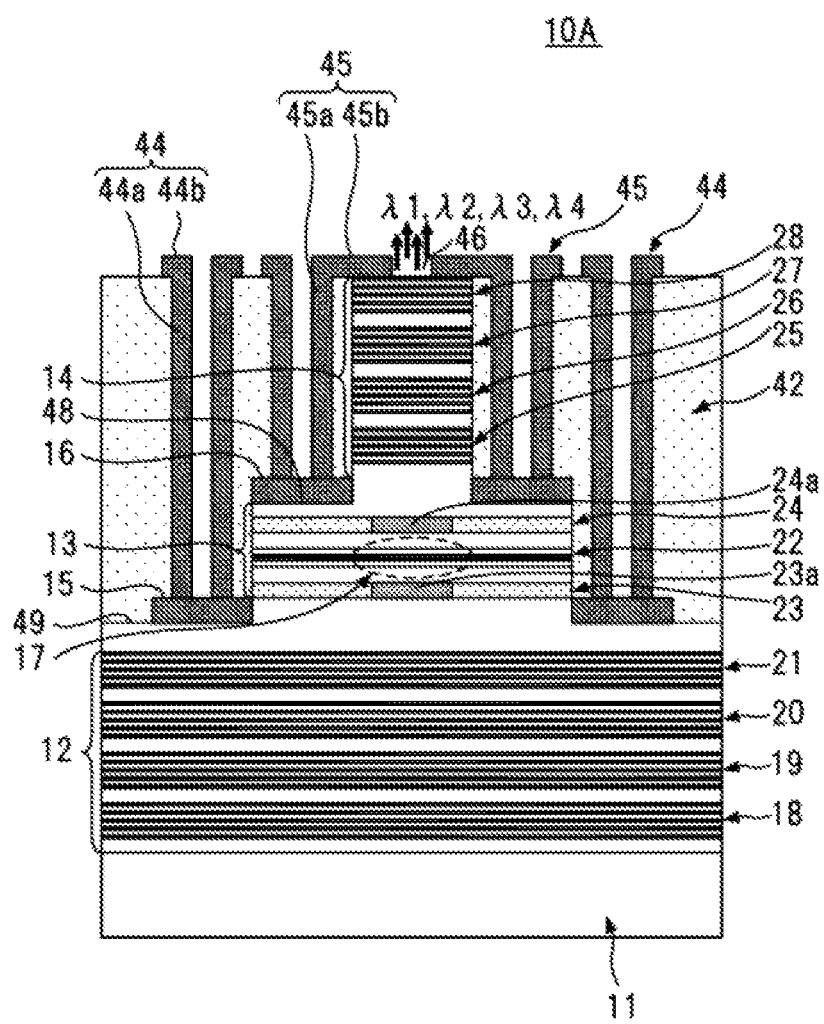
FIG. 1 is a cross-sectional view of a multiwavelength optical device according to a first embodiment of the present invention.
Figure 2:
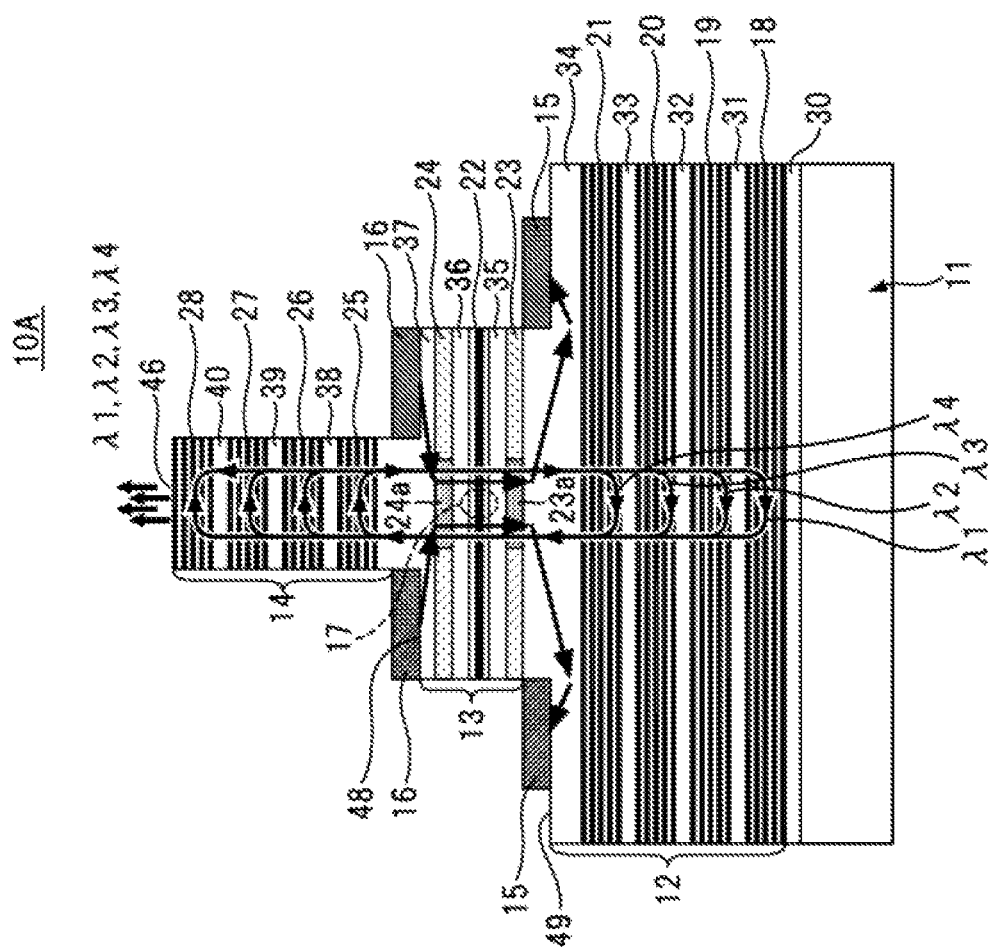
FIG. 2 is an enlarged view of the multiwavelength optical device in FIG. 1.

FIGS. 1 and 2 show a multiwavelength optical device, such as a multiwavelength laser device, 10A according to a first embodiment of the present invention. FIG. 1 is a cross-sectional view of the multiwavelength laser device 10A, and FIG. 2 is an enlarged cross-sectional view of the multiwavelength laser device 10A.

The multiwavelength laser device 10A of the first embodiment is a VCSEL device which includes a first mirror section 12, an active layer section 13, a second mirror section 14, electrodes 15 and 16, and a protective section 42. Thus, the multiwavelength laser device 10A emits laser light upward from an upper surface thereof. Further, the multiwavelength laser device 10A emits laser beams having four different wavelengths $\lambda 1$ to $\lambda 4$.

A substrate 11 is formed of GaAs and is about 300 μm in thickness. For convenience of illustration, the thickness of the substrate 11 is smaller than the thicknesses of the mirror sections 12 and 14 and the active layer section 13 in the figures.

The first mirror section 12 is stacked on the entire surface of the substrate 11. The first mirror section 12 functions as an optical resonator for resonating light emitted from the active layer section 13, in combination with the second mirror section 14 that will be described below.

In the first mirror section 12, lower mirror layers 18 to 21 and spacer layers 30 to 33 are stacked alternately. In each of the lower mirror layers 18 to 21, multiple (e.g., 20 to 30) GaAlAs layers of two kinds that are different in contents of Ga and Al are stacked alternately. The contents of Ga and Al of the GaAlAs layers are expressed by Ga(X).Al(1−X).As. The value X is set within a range of 0.0 to 1.0 in accordance with the wavelength of laser light to be reflected.

The spacer layers 30 to 34 serve to adjust the distances between the mirror layers provided on the upper and lower sides thereof so that light beams may be optimally reflected by the upper and lower mirror layers corresponding to the wavelengths thereof. The spacer layers 30 to 34 are formed by GaAlAs layers, and the composition thereof is expressed by Ga(X).Al(1−X).As, wherein X is within a range of 0.0 to 1.0. In particular, the spacer layer 34 functions as a buffer layer because the active layer section 13 is provided thereon.

The active layer section 13 is stacked on the first mirror section 12. The active layer section 13 is shaped like a cylindrical column having a diameter of about 80 μm and a thickness of about 1 μm. Hence, a step portion is formed at a boundary between the first mirror section 12 and the active layer section 13, and a second exposed portion 49 where the first mirror section 12 is exposed is provided in the step portion. An annular negative electrode 15 is provided on the second exposed portion 49 in a manner such as to surround the active layer section 13 (see FIG. 15B).

In the above-described active layer section 13, an active layer 22, a lower aperture layer 23, an upper aperture layer 24, and spacer layers 35 to 37 are stacked. The active layer 22 emits light in response to power supply from the electrodes 15 and 16 and injection of carriers. When current flows from a positive electrode 16 to the negative electrode 15 (shown by solid arrows in FIG. 2), it flows from an aperture 24a provided in the upper aperture layer 24 toward an aperture 23a provided in the lower aperture layer 23 through the active layer 22. Hence, the active layer 22 emits light at a position between a pair of apertures 23a and 24a (hereinafter this position will be referred to as a light emitting portion 17).

In the active layer 22, GaAs layers and GaAlAs layers are stacked alternately. In the first embodiment, the active layer 22 is formed by a stack of four layers of GaAs and GaAlAs layers. However, the structure of the active layer 22 is not limited thereto. Further, the composition of the GaAlAs layer is expressed by Ga(X).Al(1−X).As. The value X is appropriately set within a range of 0.0 to 1.0 in accordance with the requirements of an optoelectronic apparatus to which the multiwavelength laser device 10A is applied.

The apertures 23a and 24a provided in the centers of the lower aperture layer 23 and the upper aperture layer 24 are conductive, and portions outside the apertures 23a and 24a are insulative. More specifically, the lower and upper aperture layers 23 and 24 are formed by conductive AlAs layers, and the other portions are formed by insulative Al(X)O(Y), wherein X and Y are integers. Here, Al(X)O(Y) may be obtained by oxidizing AlAs.

The spacer layers 35 to 37 are formed by GaAlAs layers, and the composition thereof is expressed by Ga(X).Al(1−X). As, wherein X is within a range of 0.0 to 1.0. In particular, the spacer layer 37 functions as a buffer layer because the second mirror section 14 is provided thereon.

The second mirror section 14 is stacked on the active layer section 13. The second mirror section 14 is shaped like a cylindrical column, and the center axis thereof coincides with the center axis of the active layer section 13. The second mirror section 14 has a diameter of about 30 μm, which is smaller than the diameter of the active layer section 13. Hence, a step portion is formed at the boundary between the active layer section 13 and the second mirror section 14, and a first exposed portion 48 where the active layer section 13 is exposed is provided in the step portion. The positive electrode 16 is provided on the first exposed portion 48 in an annular shape such as to surround the second mirror section 14 (see FIG. 15B). The thickness of the second mirror section 14 is about 10 μm.

The second mirror section 14 functions as the optical resonator for resonating light emitted from the active layer section 13, in combination with the above-described first mirror section 12. In the second mirror section 14, upper mirror layers 25 to 28 and spacer layers 38 to 40 are stacked alternately.

In each of the upper mirror layers 25 to 28, multiple (e.g., 20 to 30) GaAlAs layers of two kinds that are different in contents of Ga and Al are stacked alternately. The contents of Ga and Al of the GaAlAs layers are expressed by Ga(X).Al (1−X).As. The value X is set within a range of 0.0 to 1.0 in accordance with the wavelength of laser light to be reflected. The spacer layers 38 to 40 are formed by GaAlAs layers, and the composition thereof is expressed by Ga(X).Al(1−X).As, wherein X is within a range of 0.0 to 1.0.

The protective section 42 is formed of an insulating resin such as polyimide. The protective section 42 is provided on the first mirror section 12 to cover the active layer section 13 and the second mirror section 14. However, a light emitting portion 46 for emitting laser light is exposed from the protective section 42. In this way, the first mirror section 12, the second mirror section 14, and the active layer section 13 are protected by being covered with the protective section 42. This enhances reliability of the multiwavelength laser device 10A.

The protective section 42 includes connecting electrodes 44 and 45, as shown in FIG. 1. The connecting electrodes 44 and 45 respectively include vias 44a and 45a and surface electrodes 44b and 45b. The via 44a is obtained by forming a conductive metal on inner walls of through holes extending to the negative electrode 15 through the protective section 42. The via 45a is obtained by forming a conductive metal on inner walls of through holes extending to the positive electrode 16 through the protective section 42.

The lower end of the via 44a is electrically connected to the negative electrode 15, and the upper end of the via 44a is connected to the surface electrode 44b provided on the surface of the protective section 42. Further, the lower end of the via 45a is electrically connected to the positive electrode 16, and the upper end of the via 45a is connected to the surface electrode 45b provided on the surface of the protective section 42. Hence, even when the electrodes 15 and 16 are covered with the protective section 42, power may be supplied to the active layer 22 because the connecting electrode 44 is electrically connected to the negative electrode 15 and the connecting electrode 45 is connected to the positive electrode 16.

Next, operation of the multiwavelength laser device 10A will be described. As described above, the multiwavelength laser device 10A of the first embodiment emits laser beams having four different wavelengths λ1 to λ4. For that purpose, the multiwavelength laser device 10A includes the four lower mirror layers 18 to 21 provided in the first mirror section 12 and the four upper mirror layers 25 to 28 provided in the second mirror section 14. Light emitted from the active layer 22 resonates between the first and second mirror sections 12 and 14 functioning as the optical resonator, and is excited in the active layer section 13. After being exited to a predetermined value, the excited light passes through the second mirror section 14 and is emitted outside from the light emitting portion 46.

In this case, the wavelength λ of the laser light emitted from the light emitting portion 46 is determined by the thicknesses of two kinds of GaAlAs layers that are different in contents of Ga and Al. In the first embodiment, a combination of the lower mirror layer 18 and the upper mirror layer 28 serves as a first optical resonator, and laser light resonated between the lower mirror layer 18 and the upper mirror layer 28 has a wavelength λ1. Further, a combination of the lower mirror layer 19 and the upper mirror layer 27 serves as a second optical resonator, and laser light resonated between the lower mirror layer 19 and the upper mirror layer 27 has a wavelength λ2.

A combination of the lower mirror layer 20 and the upper mirror layer 26 serves as a third optical resonator, and laser light resonated between the lower mirror layer 20 and the upper mirror layer 26 has a wavelength λ3. Further, a combination of the lower mirror layer 21 and the upper mirror layer 25 serves as a fourth optical resonator, and laser light resonated between the lower mirror layer 21 and the upper mirror layer 25 has a wavelength λ4. Therefore, the single multiwavelength laser device 10A may emit laser beams having four different wavelengths λ1 to λ4.

In the multiwavelength laser device 10A of the first embodiment, the apertures 23a and 23b through which current flows are provided at one position in the active layer section 13. Hence, light is emitted only from the active layer 22 in the active layer section 13. That is, the multiwavelength laser device 10A resonates light emitted from the light emitting portion 17 by the above-described four combinations of mirror layers so as to generate laser beams having different wavelengths. For this reason, the laser beams λ1 to λ4 are resonated through the apertures 23a and 23b in the up-down direction. Thus, the laser beams λ1 to λ4 are resonated at almost substantially the same position and in a substantially coaxial manner, and are all emitted from the light emitting portion 46 of the multiwavelength laser device 10A.

In the multiwavelength laser device of the related art in which laser beams having different wavelengths are emitted from different separate positions, in order to guide the emitted light beams to a single optical fiber, optical-path changing components, such as a prism and a mirror, are necessary. In contrast, in the multiwavelength laser device 10A of the first embodiment, since all laser beams λ1 to λ4 are emitted from almost substantially the same position (light emitting portion 46), they may be directly guided to the optical fiber. Hence, the prism, mirror, etc. are unnecessary, unlike the related art. This reduces the number of components and size of the optoelectronic apparatus in which the multiwavelength laser device 10A is mounted.

Now, the position of the negative and positive electrodes 15 and 16 in the multiwavelength laser device 10A is described in detail. In the multiwavelength laser device 10A, the first mirror section 12, the active layer section 13, and the second mirror section 14 are arranged in a stepwise shape (also referred to as a mesa shape). Therefore, the second exposed portion 49 where the first mirror section 12 is exposed is provided at the boundary between the first mirror section 12 and the active layer section 13. Further, the first exposed portion 48 where the active layer section 13 is exposed is provided at the boundary between the active layer section 13 and the second mirror section 14. Moreover, the positive electrode 16 is provided in the first exposed portion 48, and the negative electrode 15 is provided in the second exposed portion 49.

Accordingly, in the multiwavelength laser device 10A, the lower mirror layers 18 to 21 and the upper mirror layers 25 to 28 are not provided between a pair of electrodes 15 and 16. Hence, when current flows between the positive electrode 16 and the negative electrode 15, the current is carried through the active layer section 13, without being carried through the first mirror section 12 and the second mirror section 14.

As described above, in the mirror layers 18 to 21 and 25 to 28 provided in the first and second mirror sections 12 and 14, multiple (e.g., 20 to 30) GaAlAs layers having different contents of Ga and Al are alternately stacked, and the mirror layers have high electric resistances. Therefore, if current is passed through the mirror layers 18 to 21 and 25 to 28 in the electrode structure, power consumption of the multiwavelength laser device increases.

Since the mirror layers 18 to 21 and 25 to 28 are not provided between a pair of electrodes 15 and 16 in the first embodiment, current flows through the active layer section 13, but does not flow through the mirror layers 18 to 21 and 25 to 28. This reduces power consumption of the multiwavelength laser device 10A.

More specifically, since each of the mirror layers 18 to 21 and 25 to 28 is defined by multiple (e.g., 30 to 40) stacked layers having different characteristics, the electric resistance of one mirror layer is about 100 Å. Therefore, the total electric resistance of the mirror layers 18 to 21 and 25 to 28 is 800 Å. On the other hand, to output laser light, a current of about 10 mA is to pass through the active layer 22. In the structure of the related art in which the mirror layers are provided between a pair of electrodes, it is also necessary to pass current through the mirror layers, and the voltage necessary to output laser light is 8 V (=800×0.01).

In contrast, the mirror layers 18 to 21 and 25 to 28 are not provided between a pair of electrodes 15 and 16 in the multiwavelength laser device 10A of the first embodiment; instead the active layer 22 and the aperture layers 23 and 24 are provided therebetween. In the first embodiment, the active layer 22 is defined by four layers, and the resistance thereof is about 10 Å. For this reason, when it is assumed that the current to be passed through the active layer 22 to output laser light is about 10 mA, the voltage required in the first embodiment is 0.1 V (=10×0.01). Thus, even when the number of mirror layers is not changed, power consumption of the multiwavelength laser device 10A of the first embodiment may be lower than in the related art.

In addition, since the active layer section 13 is sandwiched between the electrodes 15 and 16 in the multiwavelength laser device 10A of the first embodiment, the first mirror section 12, the active layer section 13, and the second mirror section 14 are arranged in a stepwise shape (mesa shape), as described above. However, the stepwise shape is removed by the protective section 42, and therefore, no trouble will occur to mounting of the multiwavelength laser device 10A on the mounting substrate (substrate in the optoelectronic apparatus).

Next, a manufacturing method of the above-described multiwavelength laser device 10A will be described.

FIGS. 3 to 19 illustrate steps of a manufacturing method of the multiwavelength laser device 10A in order. In FIGS. 3 to 19, structures corresponding to the structures shown in FIGS. 1 and 2 are denoted by the same reference numerals, and descriptions thereof are omitted appropriately.

Figure 3A:
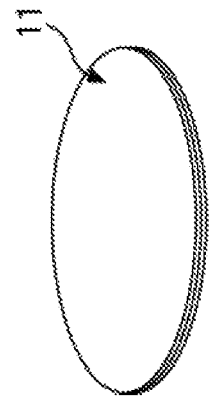
FIGS. 3A and 3B illustrate a first step in a manufacturing method of a multiwavelength laser device.
Figure 3B:
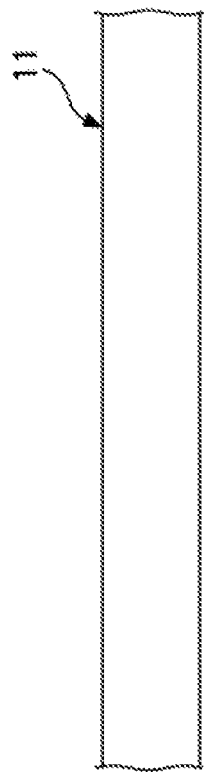

The multiwavelength laser device 10A is formed on a wafer-shaped substrate 11 of GaAs shown in FIGS. 3A and 3B. FIG. 3A is an external view of the substrate 11. Multiple multiwavelength laser devices 10A are simultaneously formed on the substrate 11. FIG. 3B is an enlarged view of an area where one multiwavelength laser device 10A is to be formed.

Figure 4:
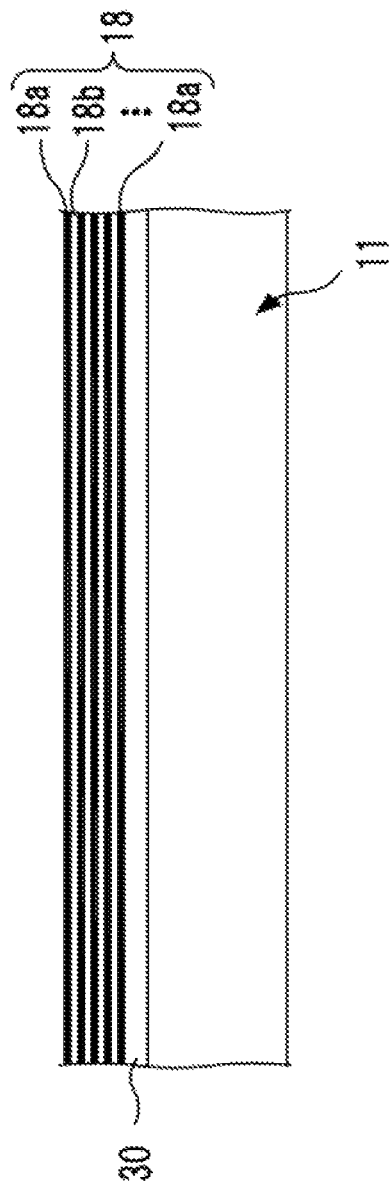
FIG. 4 illustrates a second step in the manufacturing method.

On the substrate 11, a spacer layer 30 is formed first. The spacer layer 30 is a GaAlAs layer, and the composition thereof is expressed by Ga(X).Al(1−X).As (X:0.0–1.0). Then, a lower mirror layer 18 is formed on the spacer layer 30. The lower mirror layer 18 is formed by alternately stacking two kinds of GaAlAs layers that are different in contents of Ga and Al. For example, 20 to 30 GaAlAs layers are stacked. FIG. 4 shows a state in which the spacer layer 30 and the lower mirror layer 18 have been formed. The spacer layer 30 and the lower mirror layer 18 may be formed by a known thin-film deposition method of example, vapor deposition, sputtering, or a vapor-phase growth method. Such a thin-film deposition method can similarly be applied to formation of layers subsequent to formation of the spacer layer 30 and the lower mirror layer 18.

Figure 5:
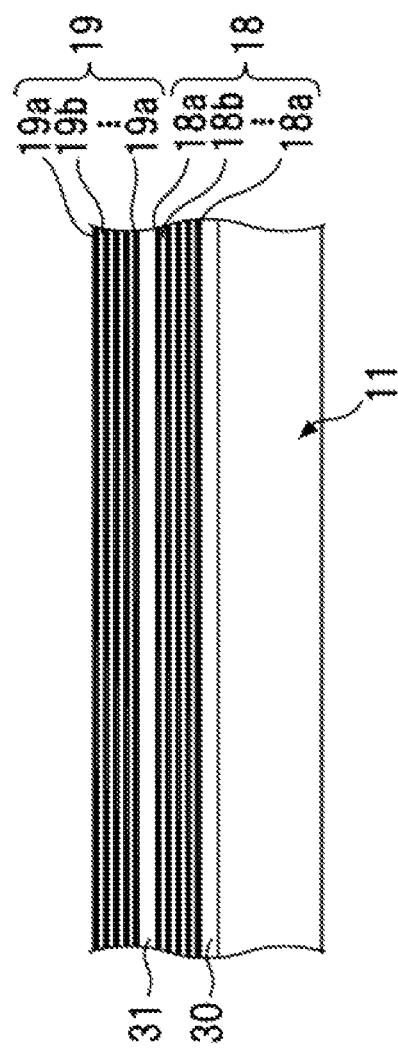
FIG. 5 illustrates a third step in the manufacturing method.

Next, a spacer layer 31 is formed on the lower mirror layer 18, and a lower mirror layer 19 is formed on the spacer layer 31. The spacer layer 31 has substantially the same structure as that of the spacer layer 30. While the lower mirror layer 19 is formed by alternately stacking two kinds of GaAlAs layers having that are different in contents of Ga and Al, similarly to the lower mirror layer 18, the thickness of the lower mirror layer 19 is different from that of the lower mirror layer 18 in order to provide different resonant wavelengths. FIG. 5 shows a state in which the spacer layer 31 and the lower mirror layer 19 have been formed.

Figure 6:
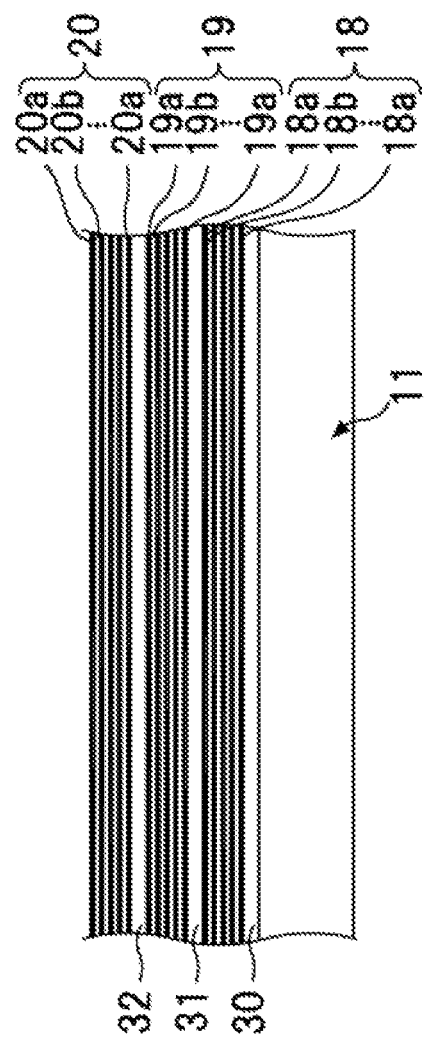
FIG. 6 illustrates a fourth step in the manufacturing method.

Next, a spacer layer 32 is formed on the lower mirror layer 19, and a lower mirror layer 20 is formed on the spacer layer 32. The spacer layer 32 has the same structure as those of the spacer layers 30 and 31. While the lower mirror layer 20 is formed by alternately stacking two kinds of GaAlAs layers that are different in contents of Ga and Al, similarly to the lower mirror layers 18 and 19, the thickness of the lower mirror layer 20 is different from the thicknesses of the lower mirror layers 18 and 19 in order to provide different resonant wavelengths. FIG. 6 shows a state in which the spacer layer 32 and the lower mirror layer 20 have been formed.

Figure 7:
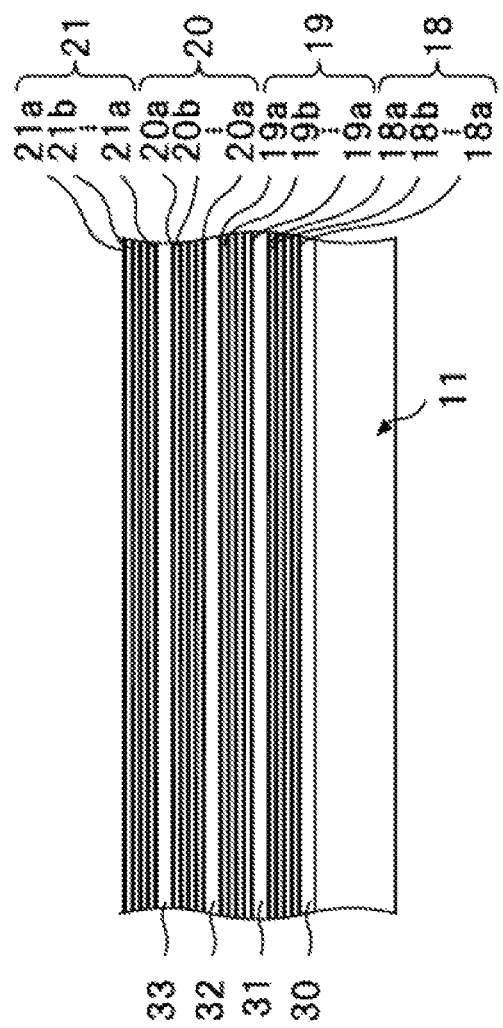
FIG. 7 illustrates a fifth step in the manufacturing method.

Next, a spacer layer 33 is formed on the lower mirror layer 20, and a lower mirror layer 21 is formed on the spacer layer 33. The spacer layer 33 has the same structure as those of the spacer layers 30 to 32. While the lower mirror layer 21 is formed by alternately stacking two kinds of GaAlAs layers that are different in contents of Ga and Al, similarly to the lower mirror layers 18 to 20, the thickness of the lower mirror layer 21 is different from the thicknesses of the lower mirror layers 18 to 20 in order to provide different resonant wavelengths. FIG. 7 shows a state in which the spacer layer 33 and the lower mirror layer 21 have been formed. By forming the lower mirror layers 18 to 21, as described above, a first mirror section 12 is formed.

Figure 8:
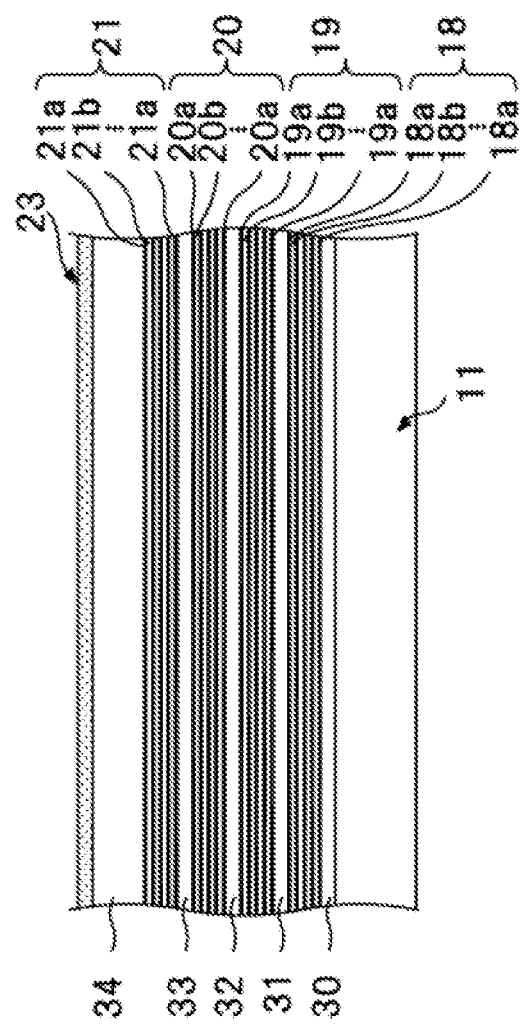
FIG. 8 illustrates a sixth step in the manufacturing method.

After the first mirror section 12 is formed on the substrate 11, a spacer layer 34 functioning as a buffer layer is formed on the lower mirror layer 21, and a lower aperture layer 23 is formed on the spacer layer 34. At this time, the lower aperture layer 23 has not been subjected to oxidation, and the entire surface thereof is an AlAs film. FIG. 8 shows a state in which the spacer layer 34 and the lower aperture layer 23 have been formed.

Figure 9:
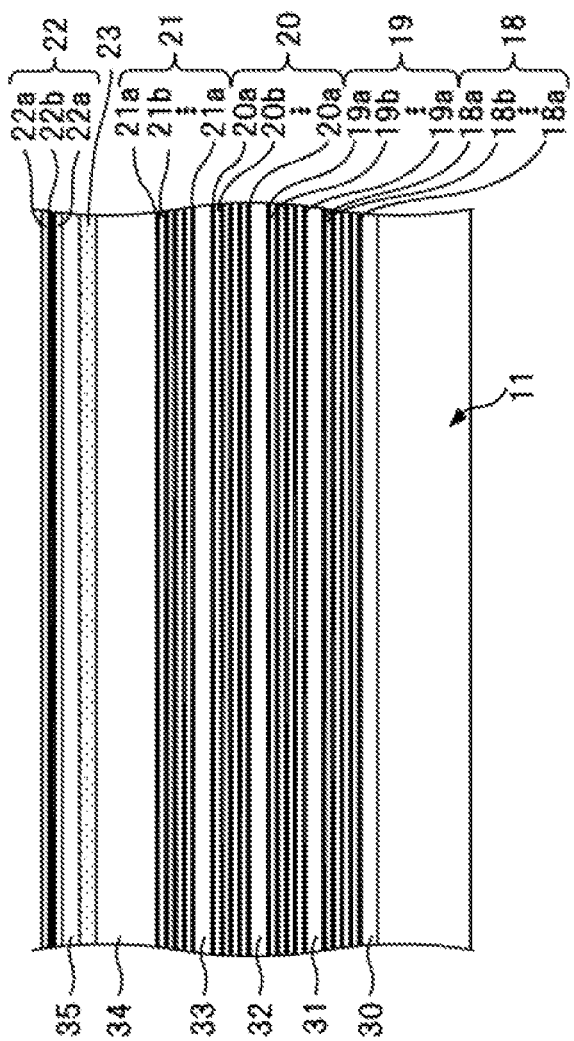
FIG. 9 illustrates a seventh step in the manufacturing method.

Then, a spacer layer 35 is formed on the lower aperture layer 23, and an active layer 22 is formed on the spacer layer 35. The active layer 22 is formed by alternately stacking GaAs layers 22a and GaAlAs layers 22b. In the first embodiment, the active layer 22 has a four-layer structure in which two GaAs layers 22a and two GaAlAs layers 22b are stacked alternately. FIG. 9 shows a state in which the spacer layer 35 and the active layer 22 have been formed.

Figure 10:
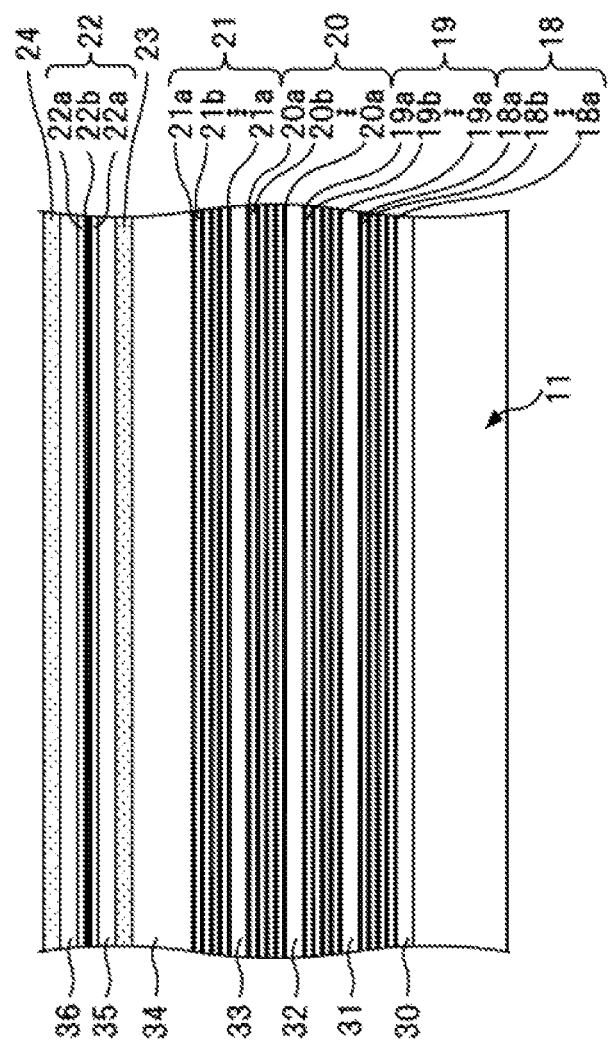
FIG. 10 illustrates an eighth step in the manufacturing method.

After the active layer 22 is formed on the lower aperture layer 23 with the spacer layer 35 being disposed therebetween, a spacer layer 36 is formed on the active layer 22, and an upper aperture layer 24 is formed on the spacer layer 36. At this time, the upper aperture layer 24 has not been subjected to oxidation, and the entire surface thereof is an AlAs film. FIG. 10 shows a state in which the spacer layer 36 and the upper aperture layer 24 have been formed.

Figure 11:
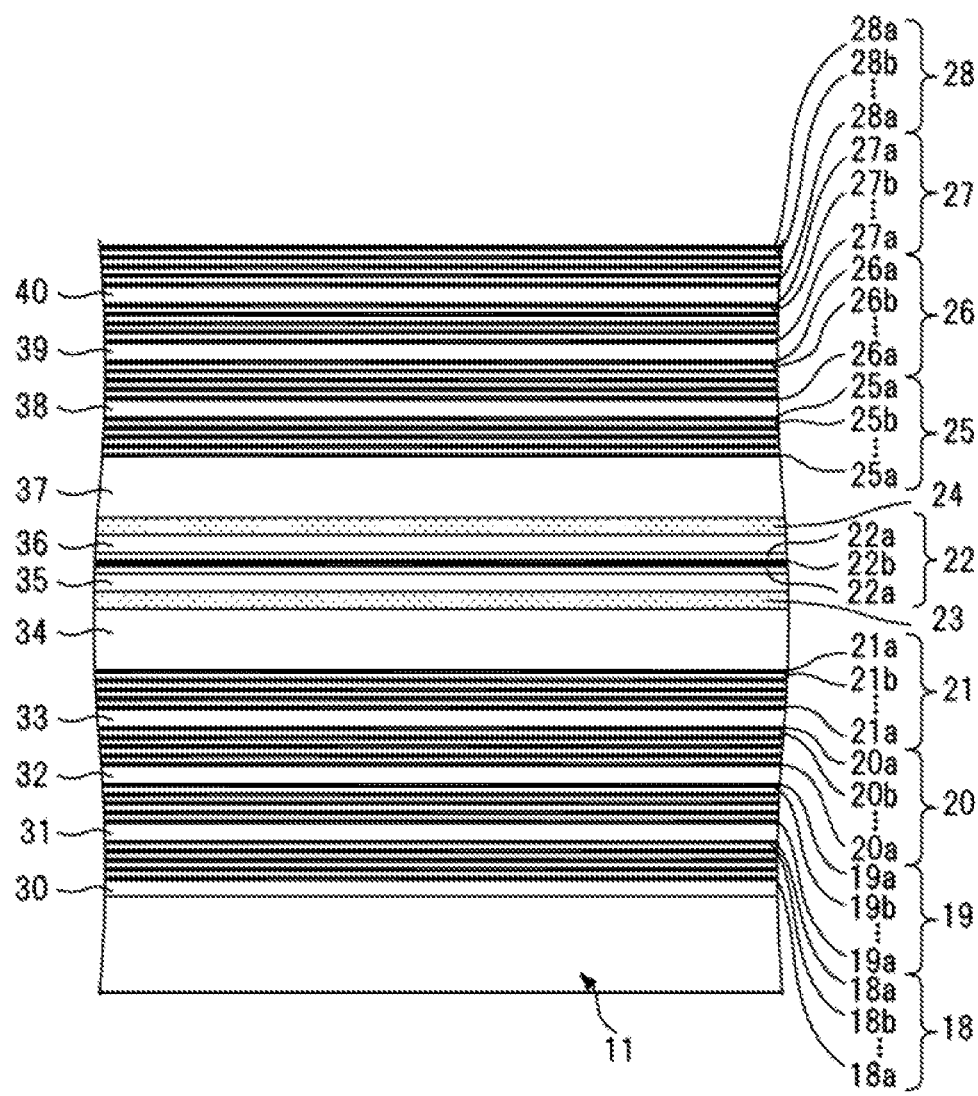
FIG. 11 illustrates a ninth step in the manufacturing method.

After the upper aperture layer 24 is formed, a spacer layer 37 functioning as a buffer layer is formed on the upper aperture layer 24, and upper mirror layers 25 to 28 and spacer layers 38 to 40 are sequentially formed on the spacer layer 37. Since the upper mirror layers 25 to 28 and the spacer layers 38 to 40 are formed by a method similar to the above-described method of forming the lower mirror layers 18 to 21 and the spacer layers 30 to 33, a description thereof is omitted. FIG. 11 shows a state in which the upper mirror layers 25 to 28 and the spacer layers 38 to 40 have been formed.

The thicknesses of the upper mirror layers 25 to 28 are set to be smaller than the thicknesses of the lower mirror layers 18 to 21. For this reason, the total thickness of the upper mirror layers 25 to 28 (including the spacer layers 38 to 40) is about 10 µm, which is smaller than the total thickness of about 15 µm of the lower mirror layers 18 to 21 (including the spacer layers 30 to 33).

Figure 12:
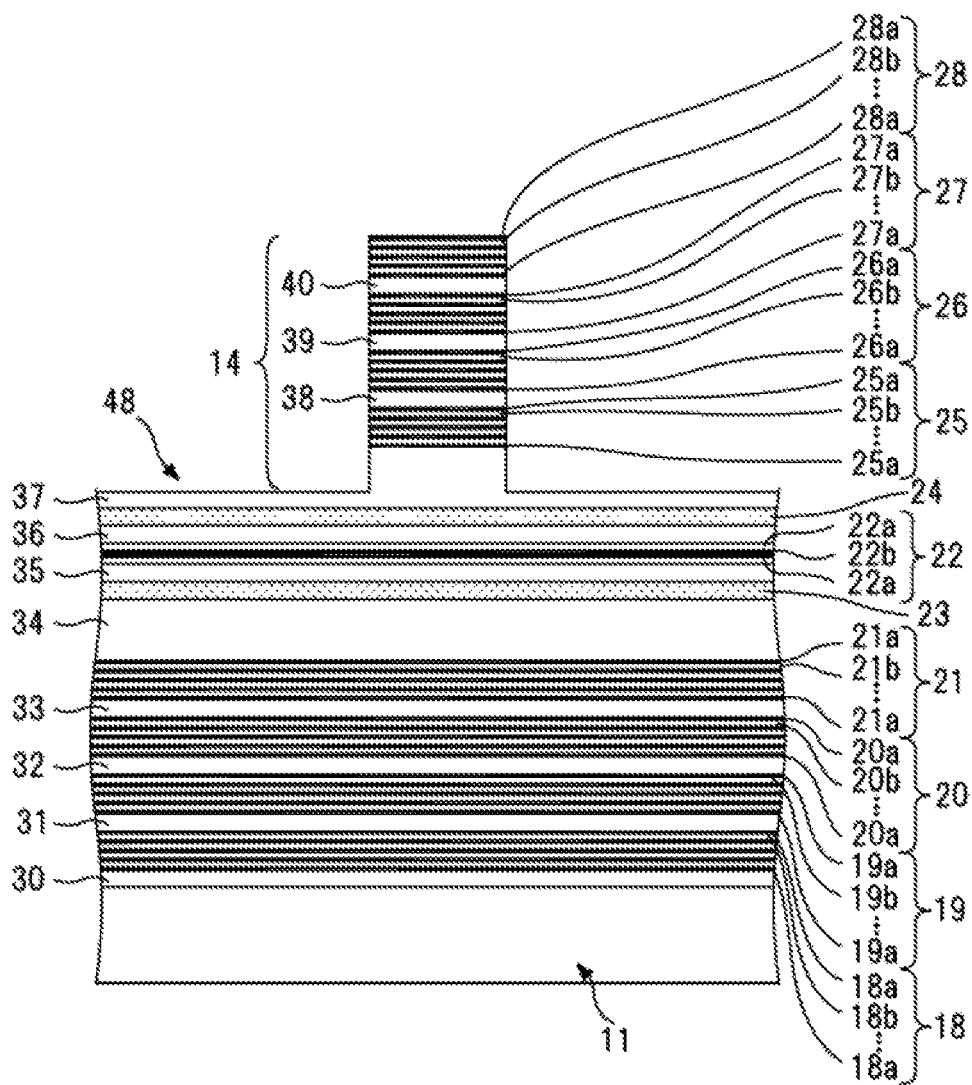
FIG. 12 illustrates a tenth step in the manufacturing method.

Next, a resist (not shown) is formed on the upper mirror layer 28, and a portion of the resist that does not correspond to the position where a second mirror section 14 is to be formed is removed. Then, the stack of the upper mirror layers 25 to 28 and the spacer layers 37 to 40 is etched using the remaining resist as a mask. By controlling the etching time, etching may be conducted to the bottom of the upper mirror layer 25. In the first embodiment, etching is continued until the spacer layer 37 is exposed, thereby forming a second mirror section 14. FIG. 12 shows a state in which the second mirror section 14 has been formed.

Figure 13:
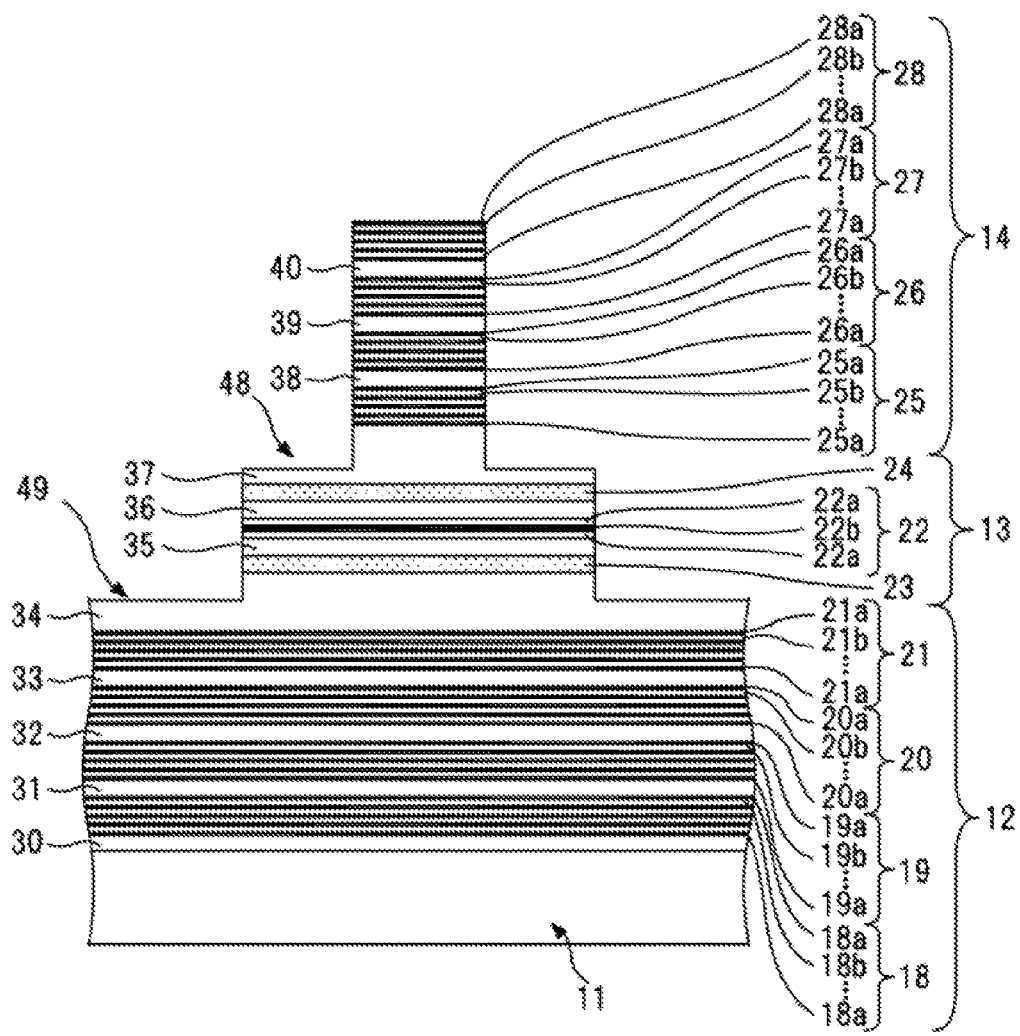
FIG. 13 illustrates an eleventh step in the manufacturing method.

After the second mirror section 14 is formed, a resist (not shown) is formed on an upper surface of the spacer layer 37 and an upper surface of the second mirror section 14, and a portion of the resist that does not correspond to the position where an active layer section 13 is to be formed is removed. Then, the stack of the active layer 22, the lower aperture layer 23, the upper aperture layer 24, and the spacer layers 34 to 37 is etched using the remaining resist as a mask. By controlling the etching time, etching is conducted to the bottom of the lower aperture layer 23. In the first embodiment, etching is continued until the spacer layer 34 is exposed, thereby forming an active layer section 13. The lower mirror layers 18 to 21 provided between the bottom of the active layer section 13 and the substrate 11 constitute the first mirror section 12. FIG. 13 shows a state in which the active layer section 13 has been provided.

Figure 14:
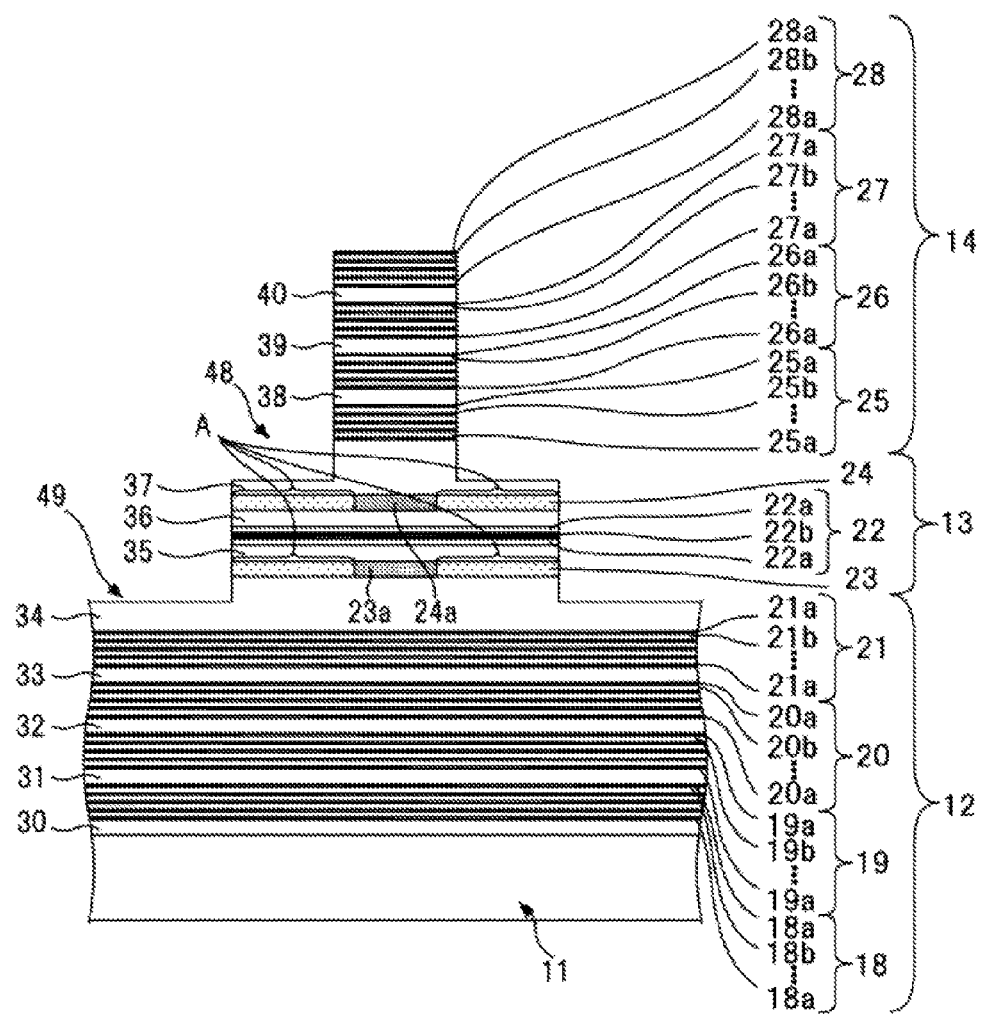
FIG. 14 illustrates a twelfth step in the manufacturing method.

Next, the lower aperture layer 23 and the upper aperture layer 24 provided in the active layer section 13 are subjected to oxidation. In this case, portions around the center portions to be apertures 23a and 24a are oxidized. Thus, the apertures 23a and 24a remain as AlAs films and maintain conductivity, and the portions around the outer peripheries of the apertures 23a and 24a are oxidized to become Al(X)O(Y) and have the insulating property. FIG. 14 shows a state in which the insulating layers have been formed around the outer peripheries of the apertures 23a and 24a. In oxidation, for example, the lower aperture layer 23 and the upper aperture layer 24 are oxidized by blowing vapor from the outside, and the size of the center portions, which are not oxidized, is controlled by adjusting the time in which the vapor is blown.

As described above, the second mirror section 14 and the active layer section 13 are formed by etching. Further, the diameter of the second mirror section 14 is set to be smaller than the diameter of the active layer section 13. Therefore, a step portion is formed at the boundary between the second mirror section 14 and the active layer section 13, and a first exposed portion 48 where the active layer section 13 is exposed is formed in the step portion. A step portion is also formed at the boundary between the active layer section 13 and the first mirror section 12, and a second exposed portion 49 where the first mirror section 12 is exposed is formed in the step portion.

Figure 15A:
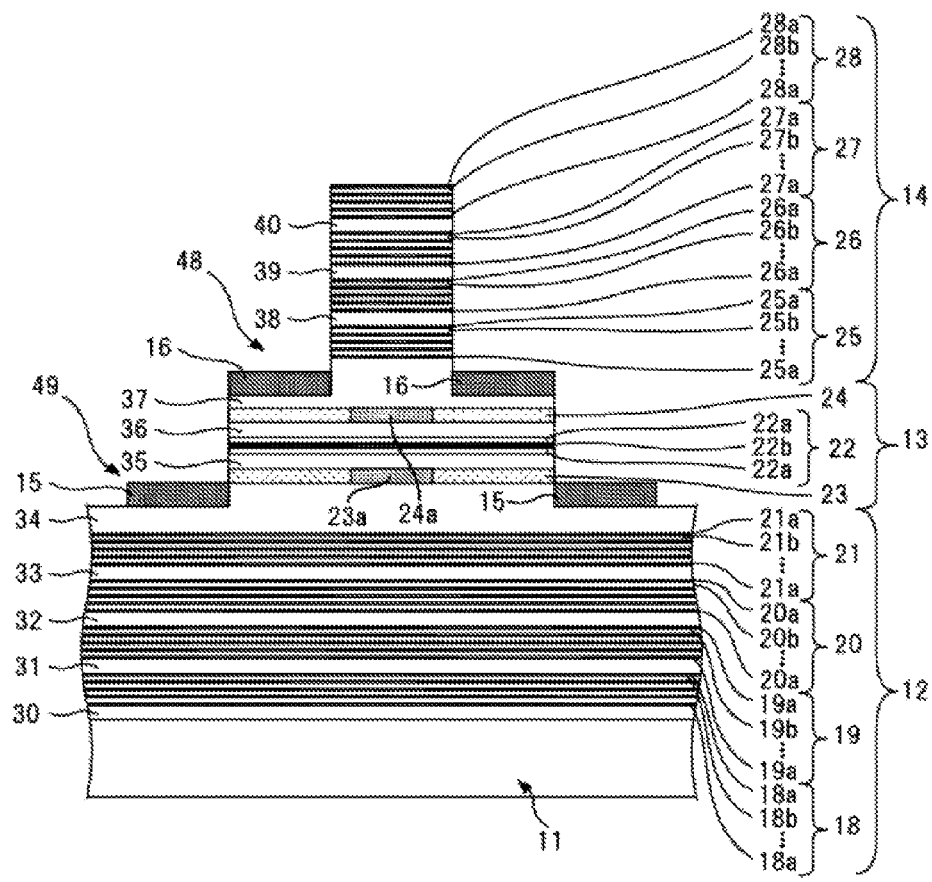
FIGS. 15A and 15B illustrate a thirteenth step in the manufacturing method.
Figure 15B:
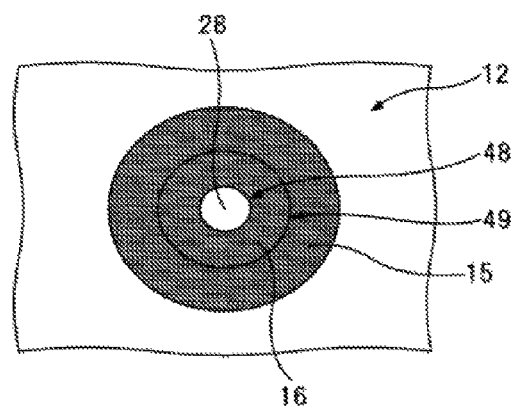

In the first embodiment, a positive electrode 16 is formed in the first exposed portion 48, and a negative electrode 15 is formed in the second exposed portion 49. The electrodes 15 and 16 are formed of Al by vapor deposition or by other methods. FIGS. 15A and 15B are a cross-sectional view and a plan view, respectively, showing a state in which the negative electrode 15 and the positive electrode 16 have been formed. Similarly, in FIGS. 16 to 19 that will be referred for the following description, FIGS. 16A, 17A, 18A, and 19A are cross-sectional views, and FIGS. 16B, 17B, 18B, and 19B are plan views.

The step portions are provided at the boundary between the first mirror section 12 and the active layer section 13 and the boundary between the active layer section 13 and the second mirror section 14, and the negative electrode 15 and the positive electrode 16 are provided in the step portions. For this reason, the annular electrodes 15 and 16 are coaxially arranged in plan view, as shown in FIG. 15B. More specifically, the positive electrode 16 is disposed on the inner side, and the negative electrode 15 is disposed outside the positive electrode 16.

With the above-described configuration, the negative electrode 15 is disposed at the top of the first mirror section 12, and the positive electrode 16 is disposed at the bottom of the second mirror section 14. Thus, the mirror layers 18 to 21 and 25 to 28 having high electric resistances are not provided between the negative electrode 15 and the positive electrode 16.

Figure 16A:
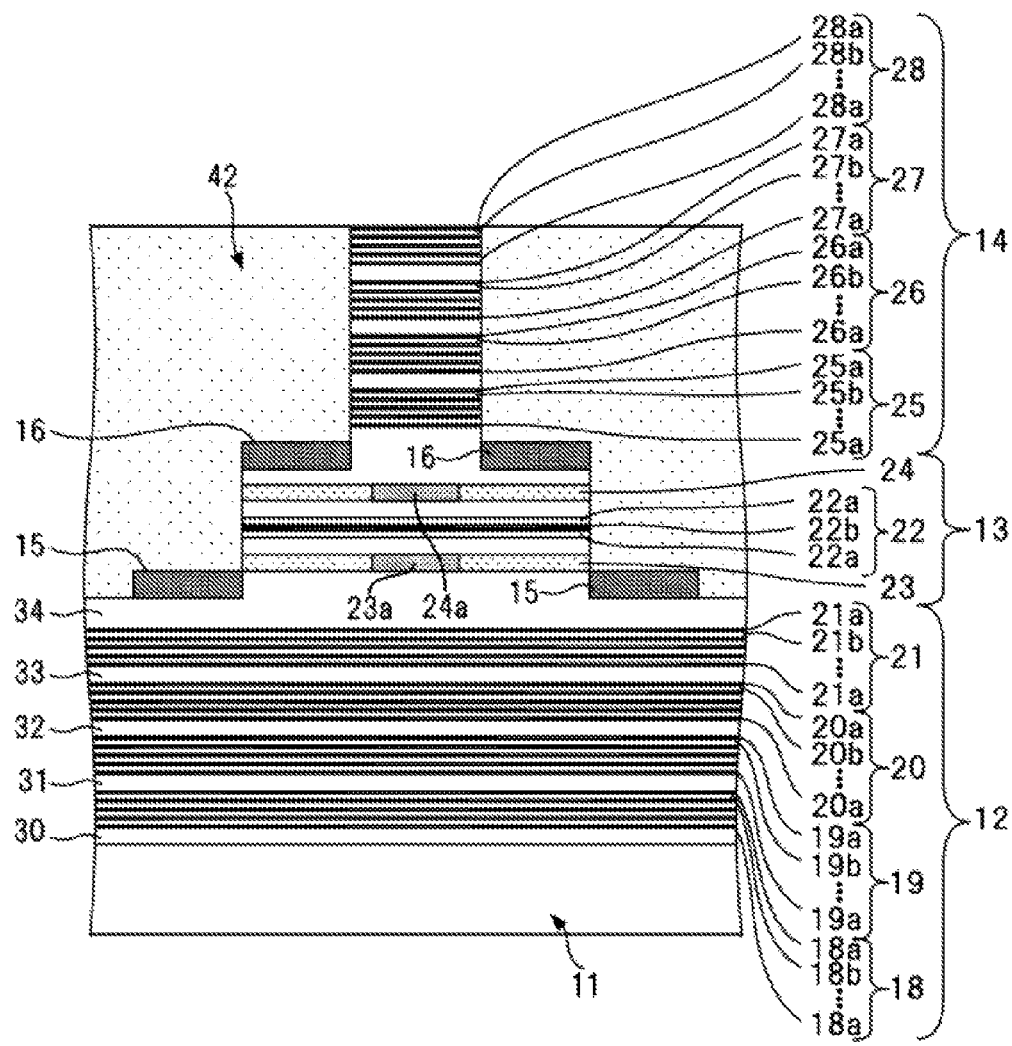
FIGS. 16A and 16B illustrate a fourteenth step in the manufacturing method.
Figure 16B:
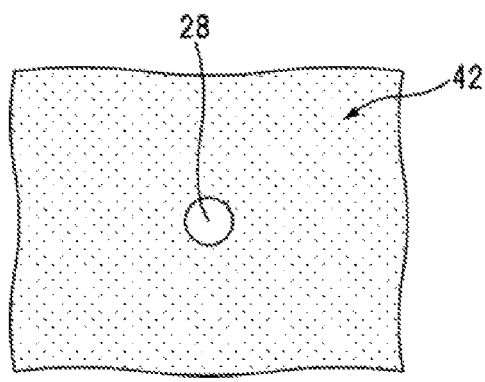

After the electrodes 15 and 16 are formed, a protective section 42 is formed to cover the electrodes 15 and 16. The protective section 42 is formed of an insulating resin, such as polyimide, and may be formed by, for example, spin coating. While the step portions are provided at the boundary between the first mirror section 12 and the active layer section 13 and the boundary between the active layer section 13 and the second mirror section 14, as described above, the protective section 42 is formed in a manner such that an upper surface thereof is flat. Further, the uppermost surface portion of the second mirror section 14 to be a light emitting portion 46 is exposed from the protective section 42. FIGS. 16A and 16B show a state in which the protective section 42 has been provided.

Figure 17A:
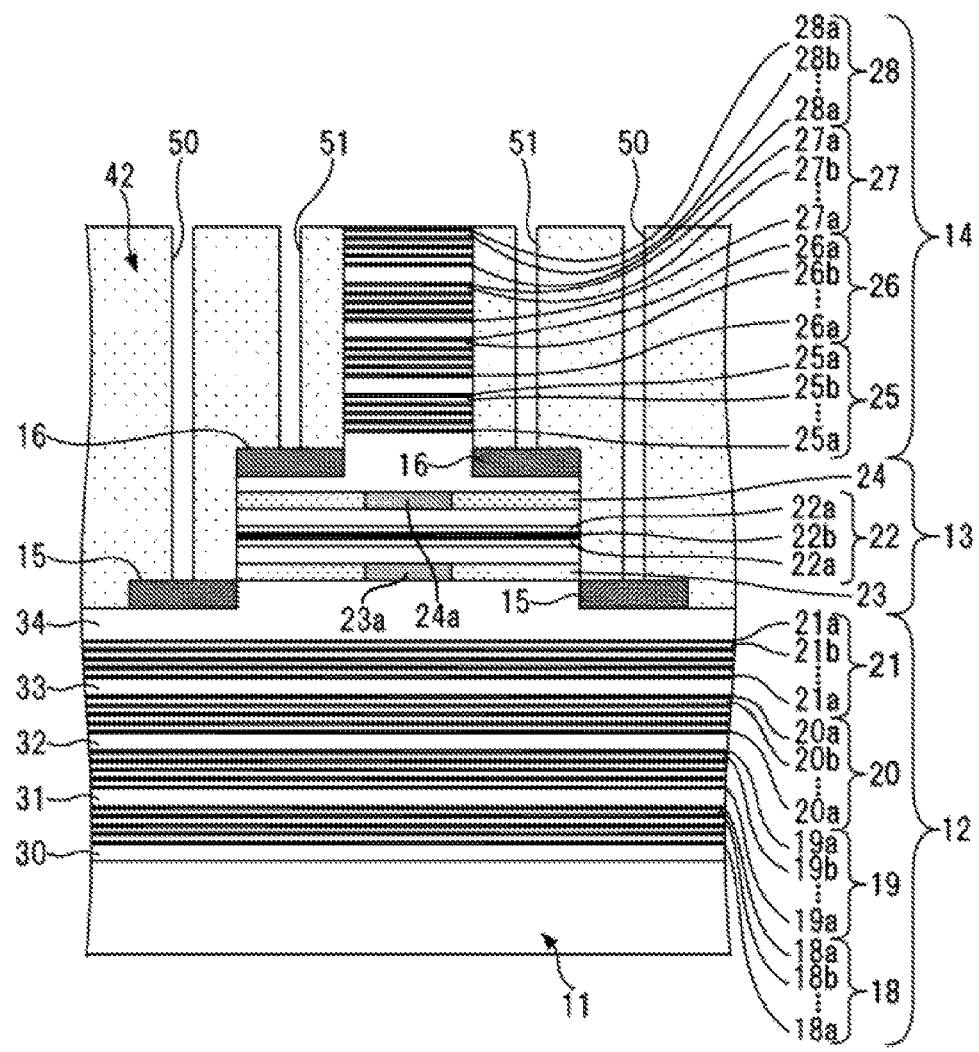
FIGS. 17A and 17B illustrate a fifteenth step in the manufacturing method.
Figure 17B:
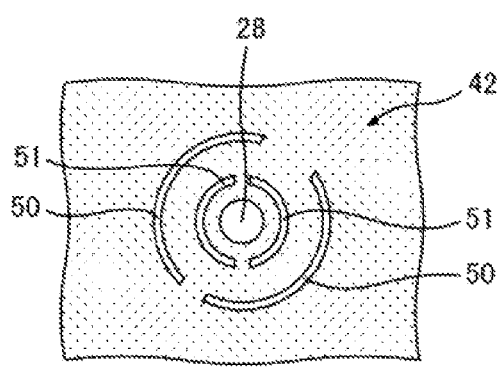

After the protective section 42 is formed, through holes 50 and 51 are formed in the protective section 42. The positions of the through holes 50 are set corresponding to the position of the negative electrode 15. Hence, the negative electrode 15 is exposed outside from the through holes 50. Similarly, the positions of the through holes 51 are set corresponding to the position of the positive electrode 16. Hence, the positive electrode 16 is exposed outside from the through holes 51. FIGS. 17A and 17B show a state in which the through holes 50 and 51 have been formed in the protective section 42. The though holes 50 and 51 may be formed by, for example, laser processing or etching.

Figure 18A:
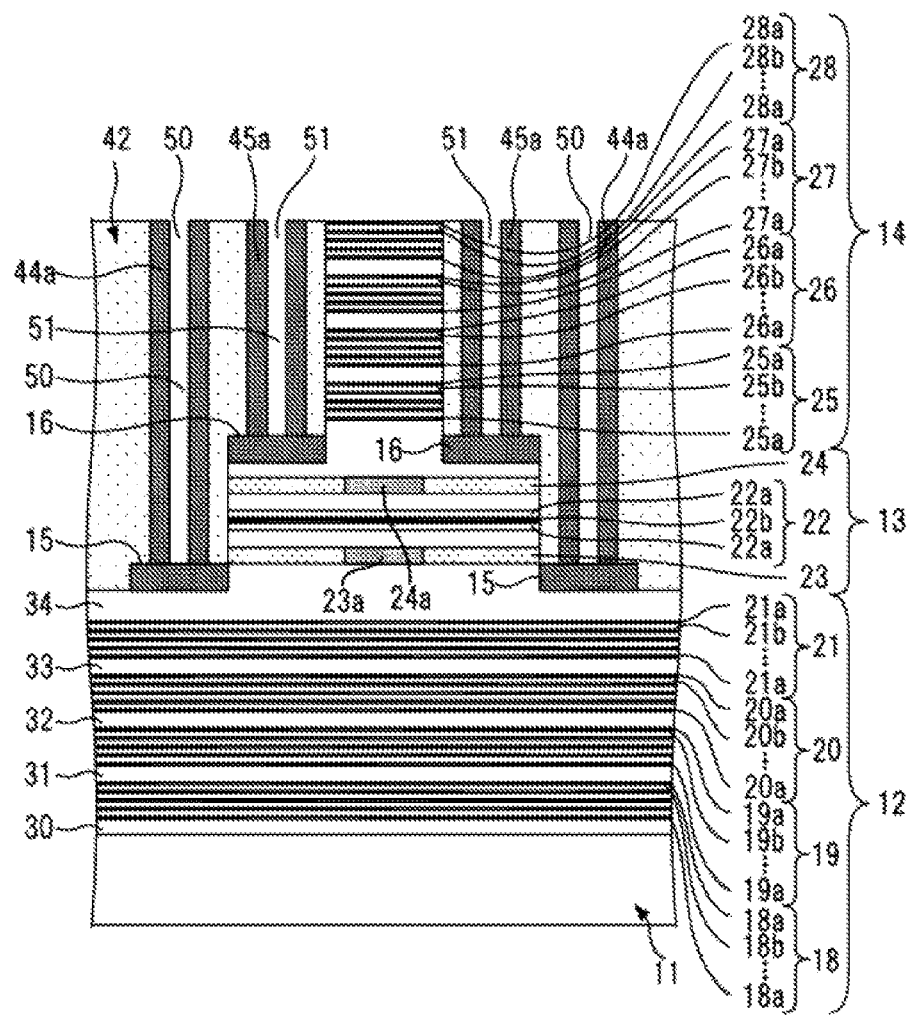
FIGS. 18A and 18B illustrate a sixteenth step in the manufacturing method.
Figure 18B:
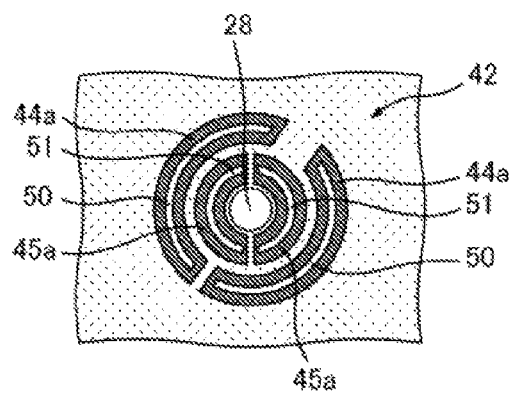

After the through holes 50 and 51 are formed, via 44a is formed on inner walls of the through holes 50, and via 45a is formed on inner walls of the through holes 51. After seed layers are formed in the through holes 50 and 51 by nonelectrolytic plating, power is supplied to the seed layers, so that the vias 44a and 45a may be formed by electrolytic plating. The vias 44a and 45a may be formed of Au. Further, lower ends of the via 44a is electrically connected to the negative electrode 15, and lower ends of the via 45a is electrically connected to the positive electrode 16. FIGS. 18A and 18B show a state in which the vias 44a and 45a have been formed in the through holes 50 and 51. The formation method of the vias 44a and 45a is not limited to the above-described method, and, for example, the vias 44a and 45a may be formed only by nonelectrolytic plating. Further, the material of the vias 44a and 45a is not limited to Au, and other conductive metals (e.g., Cu) may be used.

After the vias 44a and 45a are formed, surface electrodes 44b and 45b are formed on the surface of the protective section 42. The surface electrode 44b is formed to be electrically connected to the upper end of the via 44a. The surface electrode 45b is formed to be electrically connected to the upper end of the via 45a. The surface electrodes 44b and 45b may be formed by plating.

Figure 19A:
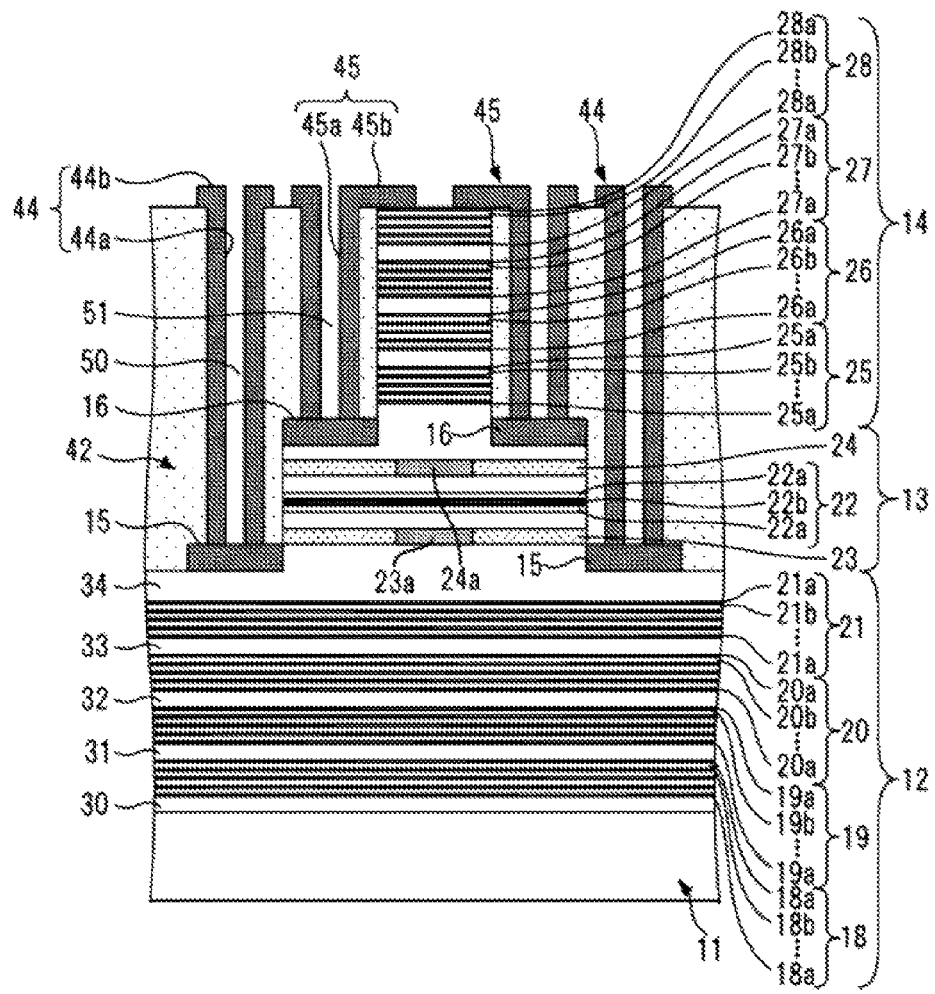
FIGS. 19A and 19B illustrate a seventeenth step in the manufacturing method.
Figure 19B:
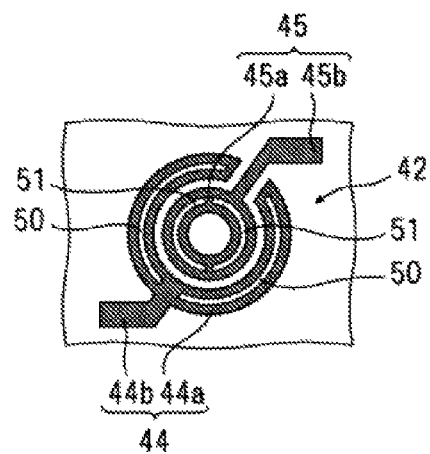

The via 44a and the surface electrode 44b constitute a connecting electrode 44 for electrical connection to the negative electrode 15. Similarly, the via 45a and the surface electrode 45b constitute a connecting electrode 45 for electrical connection to the positive electrode 16. Therefore, even when the negative electrode 15 and the positive electrode 16 are disposed deep in the protective section 42, power may be supplied to the electrodes 15 and 16 from the surface electrodes 44b and 45b provided on the surface of the protective section 42. FIGS. 19A and 19B show a state in which the connecting electrodes 44 and 45 are electrically connected to the electrodes 15 and 16.

After the connecting electrodes 44 and 45 are formed, as described above, the substrate 11 is diced into individual multiwavelength laser devices, so that the multiwavelength laser device 10A shown in FIG. 1 is produced.

A description will now be given of a multiwavelength laser device 10B and a manufacturing method therefor according to a second embodiment of the present invention.

Figure 20:
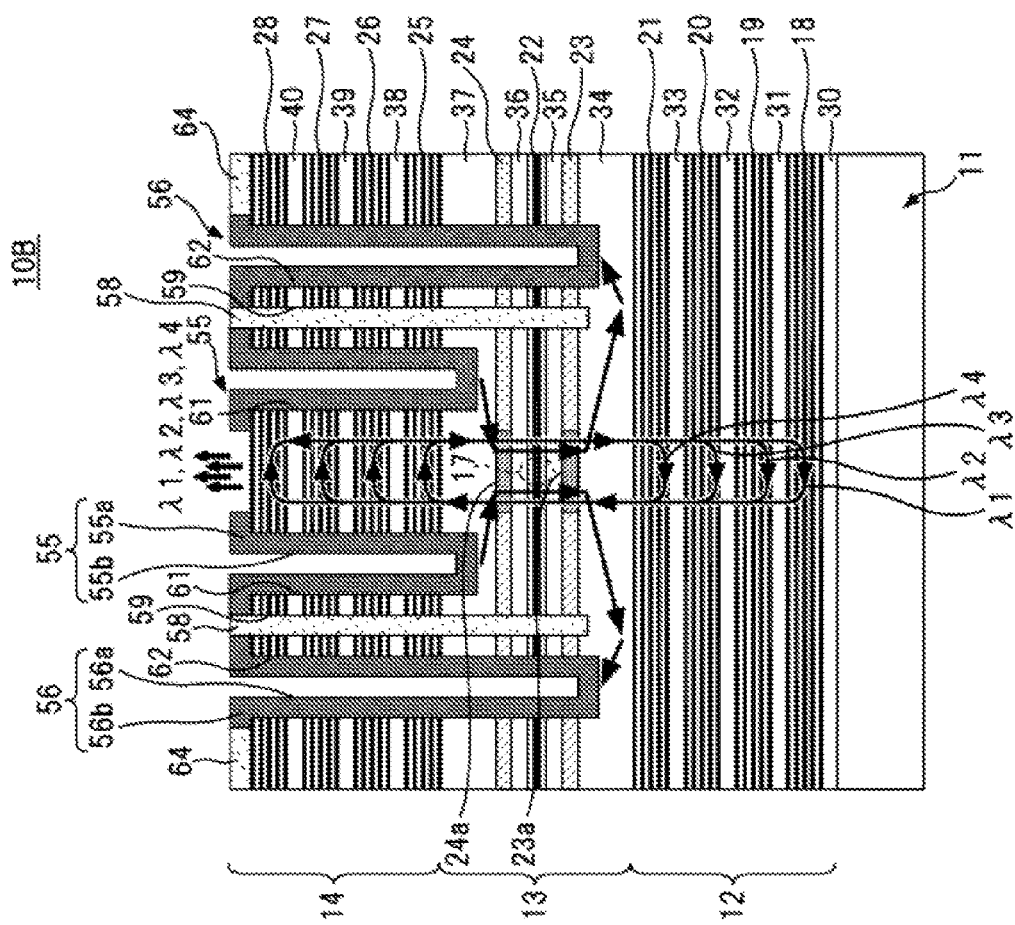
FIG. 20 is a cross-sectional view of a multiwavelength optical device according to a second embodiment of the present invention.

FIG. 20 is a cross-sectional view of the multiwavelength laser device 10B of the second embodiment. FIGS. 21 to 26 illustrate steps of a manufacturing method of the multiwavelength laser device 10B in order. In FIGS. 20 to 26, structures corresponding to the structures shown in FIGS. 1 to 19 are denoted by the same reference numerals, and descriptions thereof are omitted appropriately.

The multiwavelength laser device 10B includes a first mirror section 12, an active layer section 13, a second mirror section 14, positive and negative electrodes 55 and 56, and an insulating groove section 58. The basic structures of the first mirror section 12, the active layer section 13, and the second mirror section 14 are similar to those adopted in the multiwavelength laser device 10A of the first embodiment.

That is, the first mirror section 12 includes lower mirror layers 18 to 21 and spacer layers 30 to 33. The active layer section 13 includes an active layer 22, a lower aperture layer 23, an upper aperture layer 24, and spacer layers 35 and 36. The second mirror section 14 includes upper mirror layers 25 to 28 and spacer layers 38 to 40. The first mirror section 12 is stacked on a substrate 11, the active layer section 13 is stacked on the first mirror section 12, and the second mirror section 14 is stacked on the active layer section 13.

In the above-described multiwavelength laser device 10A of the first embodiment, the first mirror section 12, the active layer section 13, and the second mirror section 14 arranged in a stepwise shape (mesa shape) such as to be separated from one another electrically and optically. In contrast, the multiwavelength laser device 10B of the second embodiment uses the insulating groove section 58 to electrically and optically separate the first mirror section 12, the active layer section 13, and the second mirror section 14.

The insulating groove section 58 has a structure in which insulating resin is provided in an annular groove 59 that surrounds the active layer section 13 and the second mirror section 14. The annular groove 59 has a depth such as to extend below the lower aperture layer 23, and a thickness (e.g., 5 μm) such that the portions of the active layer section 13 and the second mirror section 14 inside the insulating groove section 58 are reliably electrically and optically isolated from the portions of the active layer 22 and the upper mirror layers 25 to 28 outside the insulating groove section 58. The insulating groove section 58 may be formed of, for example, polyimide resin.

The positive electrode 55 is disposed at holes 61 provided inside the insulating groove section 58 to extend to the boundary between the active layer section 13 and the second mirror section 14. The positive electrode 55 includes via 55a and a surface electrode 55b. The holes 61 each have a closed end, and extend through the second mirror section 14 to a position near an aperture 24a. The via 55a is formed by plating the interiors of the holes 61 with a conductive metal. Thus, the via 55a is cylindrical electrodes each having a closed end. Further, the surface electrode 55b is connected to the upper end of the via 55a.

The negative electrode 56 is disposed at holes 62 provided outside the insulating groove section 58 to extend to the boundary between the first mirror section 12 and the active layer section 13. The negative electrode 56 includes a via 56a and a surface electrode 56b. The holes 62 each have a closed end, and extend through the upper mirror layers 25 to 28, the active layer 22, and the aperture layers 23 and 24 to a position near an aperture 23a. The via 56a is formed by plating the interiors of the holes 62 with a conductive metal. Thus, the via 56a is cylindrical electrodes each having a closed end. Further, the surface electrode 56b is connected to the upper end of the via 56a.

Next, operation of the multiwavelength laser device 10B of the second embodiment will be described. The multiwavelength laser device 10B also includes four mirror layers 18 to 21 provided in the first mirror section 12 and four mirror layers 25 to 28 provided in the second mirror section 14. Light emitted from the active layer 22 resonates between the first and second mirror sections 12 and 14 functioning as an optical resonator, and is exited in the active layer section 13. After being excited to a predetermined value, the excited light passes through the second mirror section 14, and is emitted outside from a light emitting portion 46.

In this case, the multiwavelength laser device 10B also includes four lower mirror layers 18 to 21 in the first mirror section 12 and four upper mirror layers 25 to 28 in the second mirror section 14. Hence, laser beams with four different wavelengths of $\lambda 1$ to $\lambda 4$ are emitted from the light emitting portion 46, as in the multiwavelength laser device 10A of the first embodiment. In the second embodiment, since the laser beams with the four different wavelengths of $\lambda 1$ to $\lambda 4$ are substantially coaxially emitted together from the light emitting portion 46, it is possible to reduce the number of components and size of an optoelectronic apparatus in which the multiwavelength laser device 10B is mounted.

Further, in the second embodiment, the lower mirror layers 18 to 21 and the upper mirror layers 25 to 28 are also not provided between the bottom (lower end) of the positive electrode 55 and the bottom (lower end) of the negative electrode 56. Hence, when current is passed between the positive electrode 55 and the negative electrode 56, it flows through the active layer section 13, but does not flow through the first and second mirror sections 12 and 14 having high electric resistances. Accordingly, the multiwavelength laser device 10B may also reduce power consumption.

In the multiwavelength laser device 10B, the active layer section 13 and the second mirror section 14 are electrically and optically isolated from the outside of the insulating groove section 58 by the insulating groove section 58. Therefore, unlike the multiwavelength laser device 10A of the first embodiment, the first mirror section 12, the active layer section 13, and the second mirror section 14 do not need to be arranged in a stepwise shape (mesa shape). For this reason, the protective section 42 is unnecessary in the multiwavelength laser device 10B, unlike in multiwavelength laser device 10A of the first embodiment. This reduces the number of components and cost.

Next, a manufacturing method of the above-described multiwavelength laser device 10B will be described with reference to FIGS. 21 to 26.

The production steps that have been described with reference to FIGS. 3 to 11 are similarly performed in the manufacturing method of the multiwavelength laser device 10B of the second embodiment. Thus, descriptions of these common production steps are omitted. FIGS. 21A, 22A, 23A, 24A, 25A, and 26A are cross-sectional views illustrating production steps, and FIGS. 21B, 22B, 23B, 24B, 25B, and 26B are plan views illustrating the production steps.

Figure 21A:
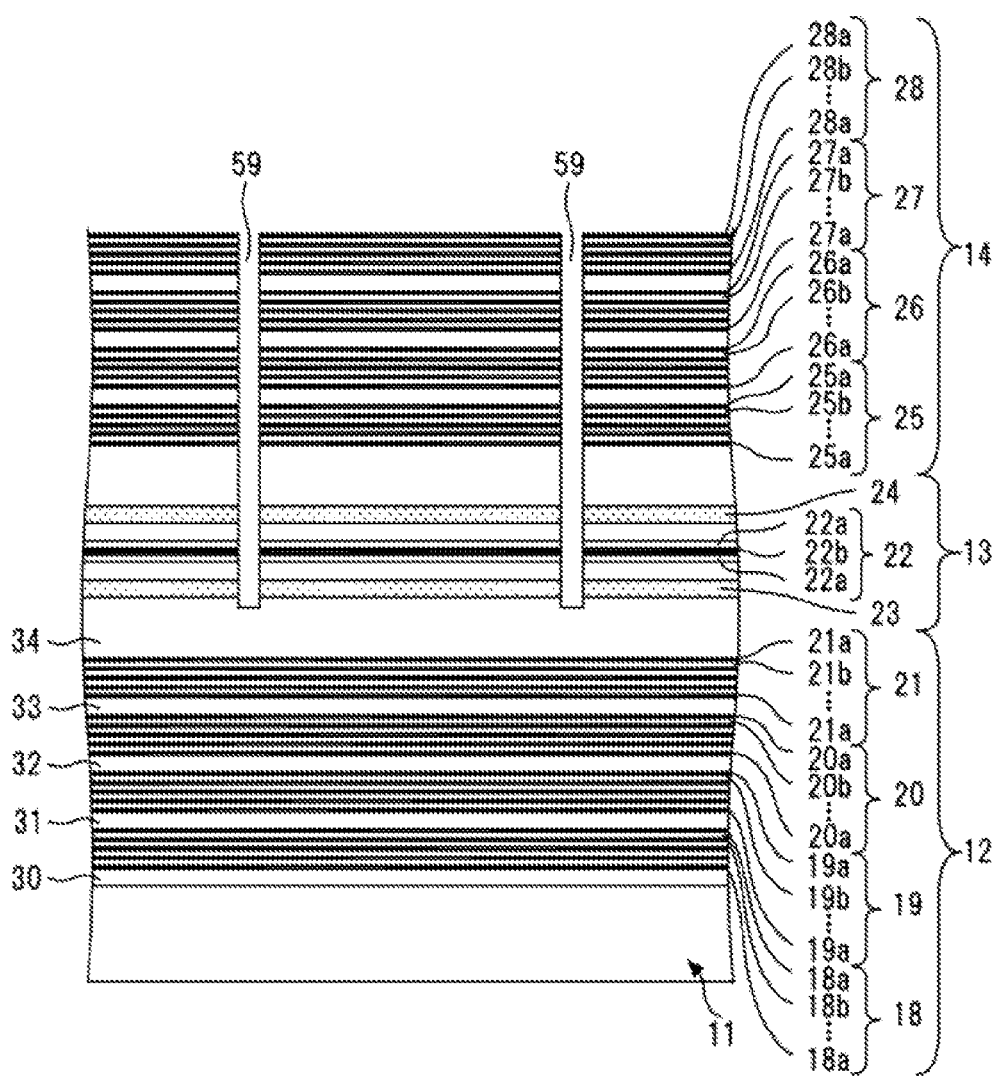
FIGS. 21A and 21B illustrate a first step in another manufacturing method of a multiwavelength optical device.
Figure 21B:
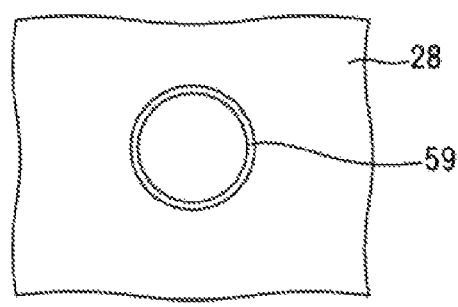

Referring to FIGS. 21A and 21B, lower mirror layers 18 to 21, a lower aperture layer 23, an active layer 22, an upper aperture layer 24, and upper mirror layers 25 to 28 are stacked on a substrate 11, and an annular groove 59 is then formed to surround the active layer section 13 and the second mirror section 14. To form the annular groove 59, a resist (not shown) is first formed on the upper mirror layer 28, and a portion of the resist corresponding to the position of the annular groove 59 is removed. Then, the stack of the upper mirror layers 25 to 28, the active layer 22, the lower aperture layer 23, the upper aperture layer 24, and the spacer layers 34 to 40 is etched using the remaining resist as a mask.

In this case, the annular groove 59 is formed to extend to the boundary between the first mirror section 12 and the active layer section 13 by controlling the etching time. More specifically, the annular groove 59 of the second embodiment extends to almost the center in the thickness direction of the spacer layer 34. FIGS. 21A and 21B show a state in which the annular groove 59 has been formed.

Figure 22A:
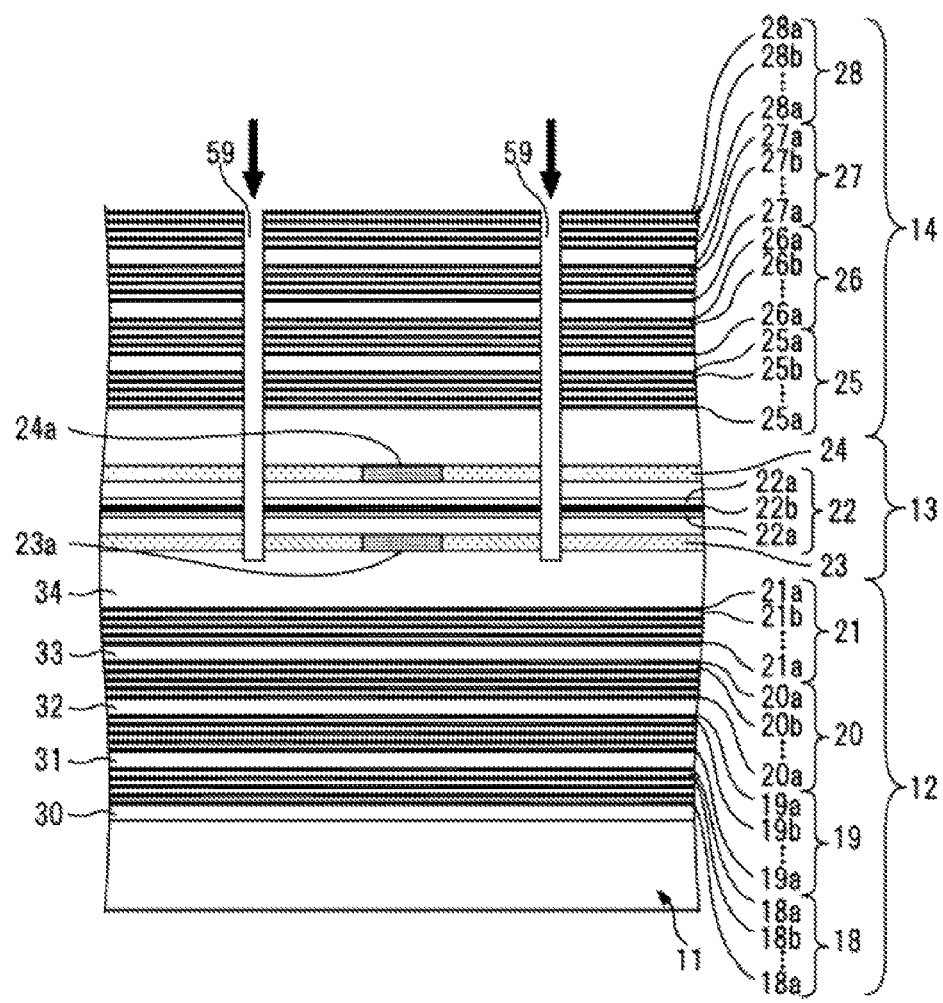
FIGS. 22A and 22B illustrate a second step in another manufacturing method.
Figure 22B:
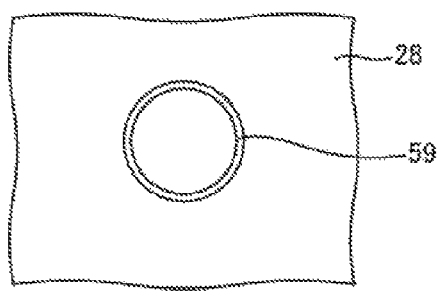

After the annular groove 59 is formed, vapor is introduced into the annular groove 59, and the lower aperture layer 23 and the upper aperture layer 24 are oxidized. This oxidation is conducted on portions other than center portions that are to be apertures 23a and 24a. Consequently, the apertures 23a and 24a remain as AlAs films and maintain conductivity. The portions around the apertures 23a and 24a are oxidized to Al(X)O(Y), and have the insulating property. FIGS. 22A and 22B show a state in which the portions around the apertures 23a and 24a have been oxidized to have the insulating property.

Figure 23A:
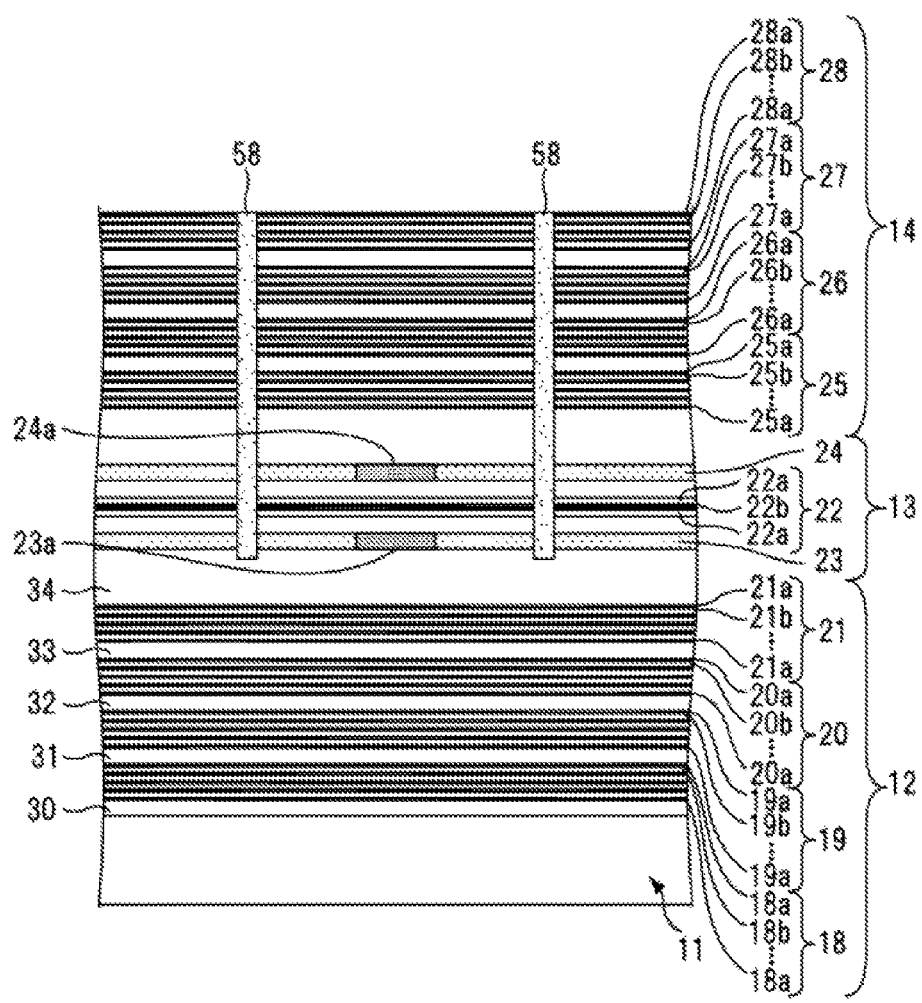
FIGS. 23A and 23B illustrate a third step in another manufacturing method.
Figure 23B:
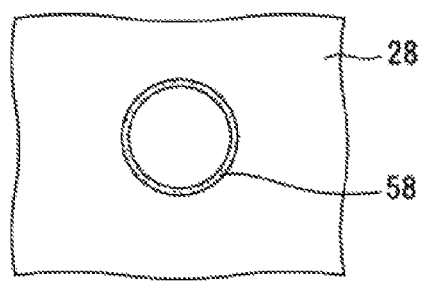

After oxidation of the aperture layers 23 and 24 is completed, an insulating groove section 58 is formed by filling the annular groove 59 with an insulating resin having a low light transmittance. The insulating resin is filled into the annular groove 59 by being dripped from a dispenser. The dripped insulating resin is filled deep in the annular groove 59 by capillary action. Then, the insulating resin is set by heating, so that the insulating groove section 58 is formed. FIGS. 23A and 23B show a state in which the insulating groove section 58 has been formed in the annular groove 59.

Figure 24A:
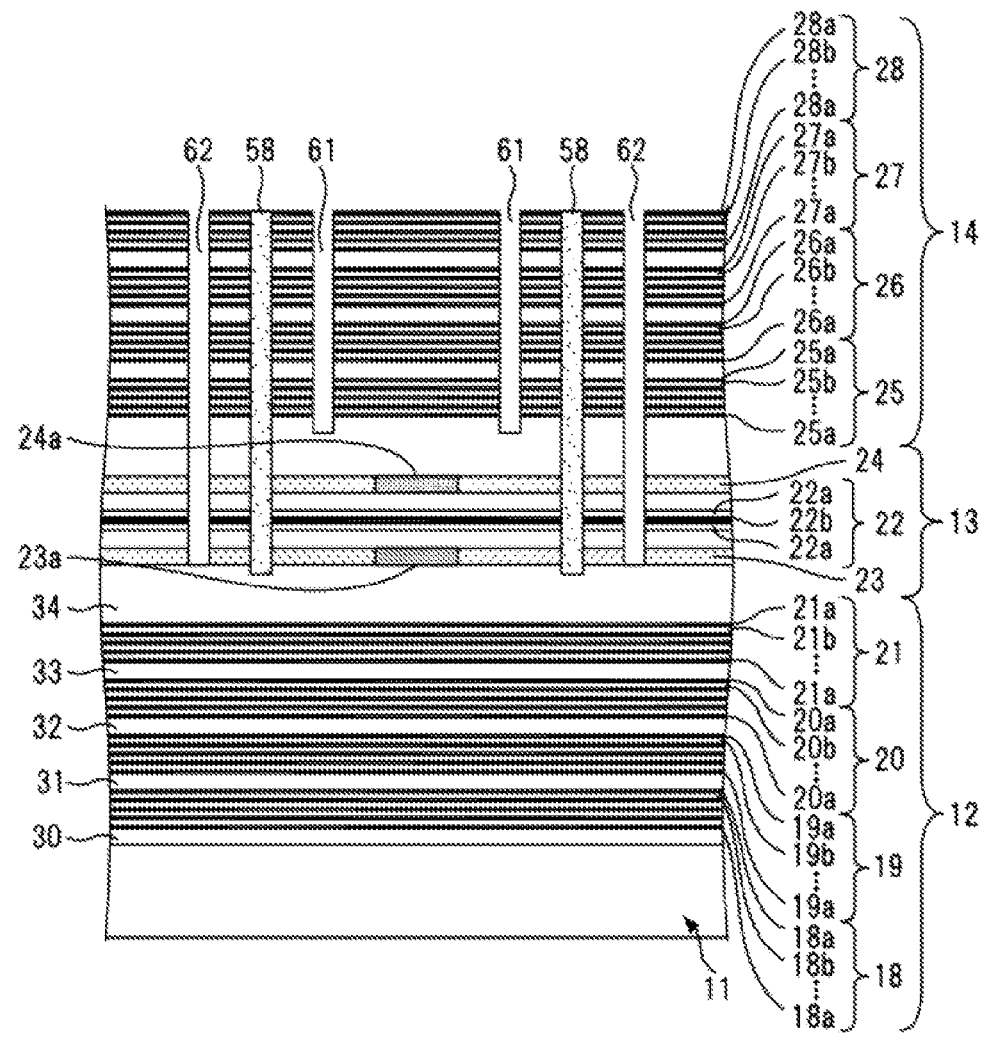
FIGS. 24A and 24B illustrate a fourth step in another manufacturing method.
Figure 24B:
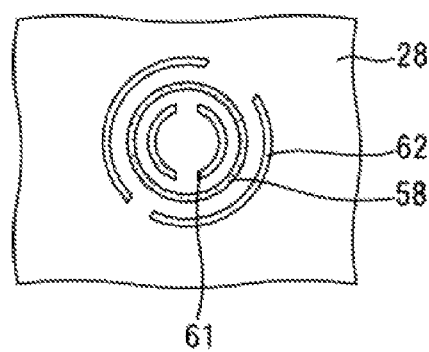

After the insulating groove section 58 is formed, holes 61 and 62 are formed. The positions of the holes 61 are set in the second mirror section 14 inside the insulating groove section 58. Further, the depth of the holes 61 is set such that the bottoms of the holes 61 are disposed at the boundary between the active layer section 13 and the second mirror section 14. The positions of the holes 62 are set outside the insulating groove section 58. Further, the depth of the holes 62 is set such that the bottoms of the holes 62 are disposed at the boundary between the first mirror section 12 and the active layer section 13. In this case, the holes 62 extend through the active layer 22, the lower aperture layer 23, the upper aperture layer 24, the upper mirror layers 25 to 28, and the spacer layers 35 to 40. FIGS. 24A and 24B show a state in which the holes 61 and 62 have been formed.

Figure 25A:
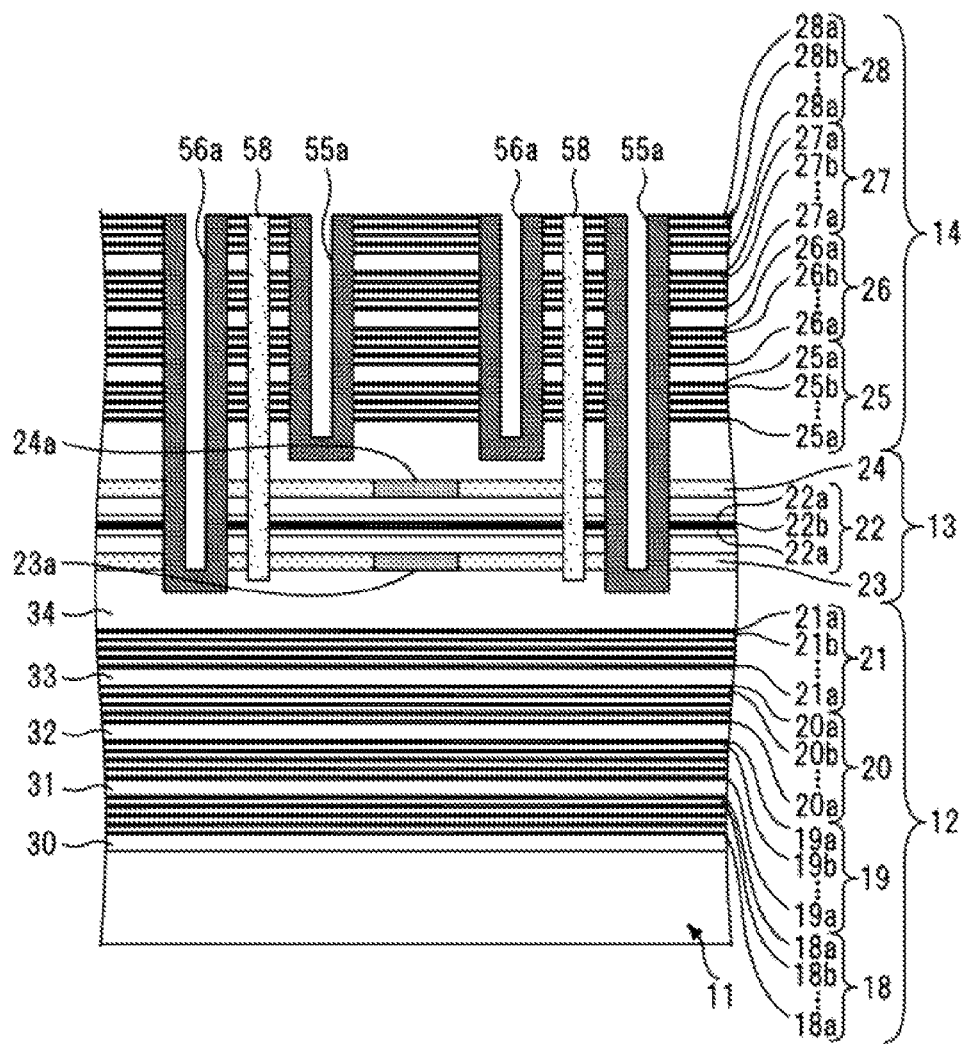
FIGS. 25A and 25B illustrate a fifth step in another manufacturing method.
Figure 25B:
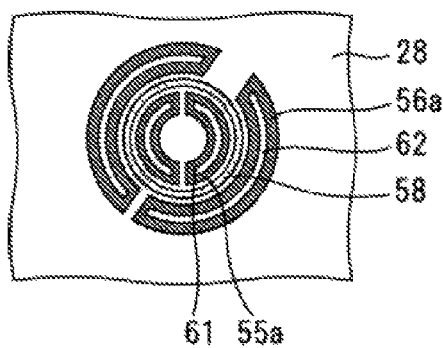

After the holes 61 and 62 are formed, wiring portions 55a are formed on inner walls of the holes 61, and wiring portions 56a are formed on inner walls of the holes 62. Seed layers are formed in the holes 61 and 62 by nonelectrolytic plating and power is supplied to the seed layers, so that the wiring portions 55a and 56a may be formed by electrolytic plating. The wiring portions 55a and 56a are formed of Au that is the same material as that of the electrodes 15 and 16. FIGS. 25A and 25B show a state in which the wiring portions 55a and 56a have been formed in the holes 61 and 62.

After the wiring portions 55a and 56a are formed, an insulating film 64 and surface electrodes 55b and 56b are formed on a surface of the upper mirror layer 28. The surface electrode 55b is electrically connected to upper ends of the wiring portions 55a, and the surface electrode 55b is electrically connected to upper ends of the wiring portions 56a. The surface electrodes 55b and 56b are formed on the insulating film 64 by plating. The insulating film 64 is formed of an insulating resin such as polyimide, and may be formed by spin coating.

Figure 26A:
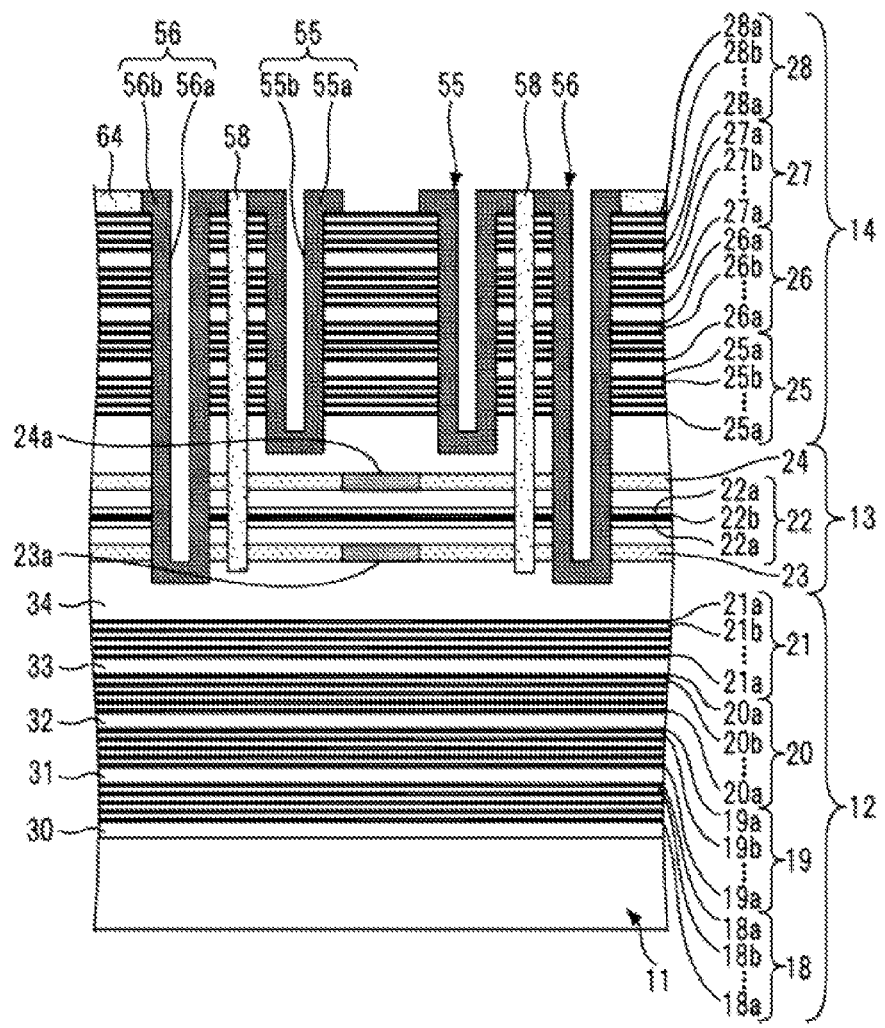
FIGS. 26A and 26B illustrate a sixth step in another manufacturing method.
Figure 26B:
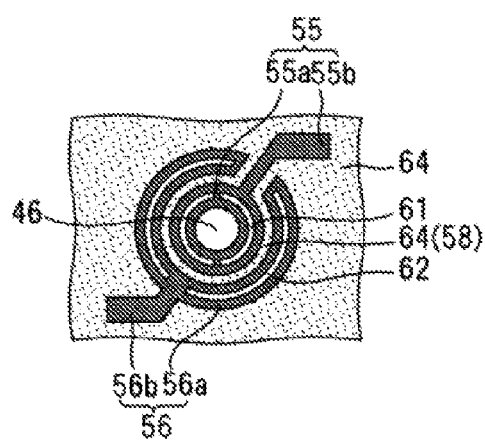

The wiring portions 55a and the surface electrode 55b constitute a positive electrode 55, and the wiring portions 56a and the surface electrode 55b constitute a negative electrode 56. Hence, even when the active layer 22 for emitting laser light is interposed between the first mirror section 12 and the second mirror section 14, the bottom of the positive electrode 55 may be disposed close to the aperture 24a, and the bottom of the negative electrode 56 may be disposed close to the aperture 23a. Accordingly, even when the active layer 22 is apart from the surface of the multiwavelength laser device 10B, power can be supplied to the active layer 22 from the surface electrodes 55b and 56b provided on the surface of the multiwavelength laser device 10B. FIGS. 26A and 26B show a state in which the positive electrode 55, the negative electrode 56, and the insulating film 64 have been formed.

After the positive electrode 55 and the negative electrode 56 are formed, as described above, the substrate 11 is diced into individual multiwavelength laser devices, so that the multiwavelength laser device 10B shown in FIG. 20 is produced.

Unlike the manufacturing method of the multiwavelength laser device 10A, the manufacturing method of the multiwavelength laser device 10B of the second embodiment does not need etching for forming a stepwise shape (mesa shape) by the first mirror section 12, the active layer section 13, and the second mirror section 14. Further, the manufacturing method does not need the step of forming the protective section 42 in order to flatten the stepwise shape (mesa shape). In addition, the insulating groove section 58 may be formed with the same apparatus as the apparatus for machining the holes 61 and 62 during formation of the electrodes 55 and 56, and the insulating resin serving as the insulating groove section 58 may be easily filled with the dispenser. Therefore, according to the manufacturing method of the second embodiment, the multiwavelength laser device 10B may be produced easily.

While various embodiments of the present invention have been described above, the present invention is not limited to the above-described specific embodiments, and various modifications and alterations may be made within the scope of the present invention described in the claims.

For example, in the above embodiments, the four lower mirror layers 18 to 21 are provided in the first mirror section 12, and the four upper mirror layers 25 to 28 are provided in the second mirror section 14. However, the number of mirror layers stacked in each mirror section is not limited to four, and may be other numbers. The number of stacked layers may be appropriately set in accordance with the desired number of laser beams simultaneously emitted from the light emitting portion 46.

Description will be given of the detailed structures of the mirrors for reflecting the laser beams λ1 to λ4 and a method of controlling the composition amount of Ga(X).Al(1−X).As.

The wavelength of laser light to be reflected is determined by the thickness of the mirror layer in which the value X in Ga(X).Al(1−X).As is changed. That is, the wavelength of the laser light to be reflected is changed by changing the thickness of the mirror layer. The mirrors are formed by alternately stacking layers having different refraction index. When the amount of Al is large, the refraction index is low. That is, a mirror layer having a composition $Ga_{0.05}.Al_{0.95}.Al$ has a lower refraction index than a mirror layer having a composition $Ga_{0.5}.Al_{0.5}$. As. The composition amounts of Ga and Al are adjusted by changing the pressure of carrier gas that carries, into the furnace, a gaseous As compound and organic metals Ga and Al which are gasified at high temperature.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

What is claimed is:

1. An optical device comprising:
a substrate;
a first mirror section including a plurality of first mirror layers stacked on the substrate;
an active layer stacked on the first mirror section, the active layer including a light emission portion;
a second mirror section including a plurality of second mirror layers stacked on the active layer;
a first spacer layer provided between the first mirror section and the active layer;
a second spacer layer provided between the second mirror section and the active layer;
a first electrode having at least one portion disposed at a lower stack than the second mirror section and contacting with the second spacer layer;
a second electrode having at least one portion disposed above the first mirror section and contacting with the first spacer layer; and
an insulating groove section configured to penetrate the second mirror section, the second spacer layer and the active layer,
wherein the first electrode is disposed in a first hole provided inside the insulating groove section, the first hole extending to a boundary between the active layer and the second spacer layer, and
the second electrode is disposed in a second hole provided outside the insulating groove section, the second hole extending to a boundary between the first spacer layer and the active layer.

2. The optical device according to claim 1, wherein the at least one portion of the first electrode is disposed above the active layer.

3. The optical device according to claim 1, wherein the at least one portion of the second electrode is disposed at a lower stack than the active layer.

4. The optical device according to claim 1, wherein the first mirror section and the second mirror section are not provided between the first electrode and the second electrode.

5. The optical device according to claim 1, wherein the first electrode is disposed on a step portion of the second spacer layer, and the second electrode is disposed on a step portion of the first spacer layer.

6. The optical device according to claim 1, further comprising a pair of aperture layers each having a single aperture and interposing the active layer therebetween,
wherein light is emitted through the single aperture.

7. The optical device according to claim 1, wherein
the first mirror layers include at least a first inner mirror layer and a first outer mirror layer stacked above the first inner mirror layer,
the second mirror layers include at least a second inner mirror layer and a second outer mirror layer stacked below the second inner mirror layer,
the first inner mirror layer and the second inner mirror layer resonate a first wavelength component of a light emitted from the active layer, and
the first outer mirror layer and the second outer mirror layer resonate a second wavelength component of the light emitted from the active layer, the second wavelength component being different from the first wavelength component.

8. The optical device according to claim 1, wherein
the plurality of first mirror layers include a first mirror layer, a second mirror layer and a third spacer layer between the first mirror layer and the second mirror layer,
the plurality of second mirror layers include a third mirror layer, a fourth mirror layer and a fourth spacer layer between the third mirror layer and the fourth mirror layer,
the first mirror layer, the second mirror layer, the third mirror layer and the fourth mirror layer respectively include a plurality of layers, each of which is made of a semiconductor material having content different from each other,
a thicknesses of the first mirror layer and the third mirror layer are set to make a first optical resonator between the first mirror layer and the third mirror layer with respect to a first wavelength, and
a thicknesses of the second mirror layer and the fourth mirror layer are set to make a second optical resonator between the second and fourth mirror layer with respect to a second wavelength.

9. An optical device comprising:
a substrate;
a first mirror section including a plurality of first mirror layers stacked on the substrate;
an active layer stacked on the first mirror section, the active layer including a light emission portion;
a second mirror section including a plurality of second mirror layers stacked on the active layer;
a first spacer layer provided between the first mirror section and the active layer;
a second spacer layer provided between the second mirror section and the active layer;
a first electrode having at least one portion disposed at a lower stack than the second mirror section and contacting with the second spacer layer;
a second electrode having at least one portion disposed above the first mirror section and contacting with the first spacer layer;
a protective section configured to cover the first and second electrodes; and
a connecting electrode including a via extending through the protective section and a surface electrode disposed on the protective section,
wherein one end of the via is connected to one of the first electrode and the second electrode, and
the other end of the via is connected to the surface electrode.

10. The optical device according to claim 9, wherein the surface electrode is formed by plating.

11. The optical device according to claim 9, wherein
the plurality of first mirror layers include a first mirror layer, a second mirror layer and a third spacer layer between the first mirror layer and the second mirror layer,
the plurality of second mirror layers include a third mirror layer, a fourth mirror layer and a fourth spacer layer between the third mirror layer and the fourth mirror layer,
the first mirror layer, the second mirror layer, the third mirror layer and the fourth mirror layer respectively include a plurality of layers, each of which is made of a semiconductor material having content different from each other, a thicknesses of the first mirror layer and the third mirror layer are set to make a first optical resonator between the first mirror layer and the third mirror layer with respect to a first wavelength, and a thicknesses of the second mirror layer and the fourth mirror layer are set to make a second optical resonator between the second and fourth mirror layer with respect to a second wavelength.

\* \* \* \* \*